(12) United States Patent
Morise et al.

(10) Patent No.: US 7,532,503 B2
(45) Date of Patent: May 12, 2009

(54) MAGNETIC RECORDING ELEMENT, MAGNETIC RECORDING APPARATUS AND RECORDING METHOD OF INFORMATION

(75) Inventors: Hirofumi Morise, Kawasaki (JP); Shiho Nakamura, Fujisawa (JP); Shigeru Haneda, Yokohama (JP); Takahiro Hirai, Yokohama (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 681 days.

(21) Appl. No.: 11/305,884

(22) Filed: Dec. 19, 2005

(65) Prior Publication Data

US 2006/0132990 A1 Jun. 22, 2006

(30) Foreign Application Priority Data

Dec. 20, 2004 (JP) ............................. 2004-368190

(51) Int. Cl.
*G11C 7/00* (2006.01)
(52) U.S. Cl. ...................................... 365/158; 365/173
(58) Field of Classification Search ................. 365/158, 365/173
See application file for complete search history.

(56) References Cited

U.S. PATENT DOCUMENTS

| | | | |
|---|---|---|---|
| 6,532,164 B2 | 3/2003 | Redon et al. | |
| 6,956,765 B2* | 10/2005 | Saito et al. | 365/158 |
| 2003/0002231 A1* | 1/2003 | Dee | 360/324.12 |
| 2006/0098477 A1* | 5/2006 | Sugibayashi et al. | 365/158 |
| 2006/0114712 A1* | 6/2006 | Braun | 365/158 |
| 2006/0132990 A1* | 6/2006 | Morise et al. | 360/324.12 |
| 2006/0262594 A1* | 11/2006 | Fukumoto | 365/158 |

FOREIGN PATENT DOCUMENTS

JP 2002-261352 9/2002

OTHER PUBLICATIONS

Albert et al., "Spin-polarized current switching of a Co thin film nanomagnet", Applied Physics Letters, vol. 77, No. 23, Dec. 4, 2000, pp. 3809-3811.
Koch et al., "Time-Resolved Reversal of Spin-Transfer Switching in a Nanomagnet", Physical Review Letters, vol. 92, No. 8, Feb. 27, 2004.

(Continued)

*Primary Examiner*—Michael T Tran
(74) *Attorney, Agent, or Firm*—Nixon & Vanderhye PC

(57) ABSTRACT

A magnetic recording element includes a first fixed layer having a first and second face and having a magnetization direction fixed in a direction penetrating the first and second face. A free layer has a third and fourth face, a magnetization easy and hard axis both extending along the third or fourth face, and a magnetization direction which changes according to a direction of a current flowing through the first and fourth face with a magnetic field applied in a fixed direction or according to a direction of a magnetic field applied to the free layer with a current flowing through the first and fourth face in a fixed direction. A nonmagnetic first intermediate layer is provided between the second and third face. A magnetic field generating layer applies a magnetic field smaller than the anisotropy field of the free layer to the free layer along the magnetization hard axis.

20 Claims, 26 Drawing Sheets

OTHER PUBLICATIONS

Kent et al., "Spin-transfer-induced precessional magnetization reversal", Applied Physics Letters, vol. 84, No. 19, May 10, 2004, pp. 3897-3899.

J.C. Slonczewski, "Current-driven excitation of magnetic multilayers", Journal of Magnetism and Magnetic Materials, 159, (1996).

* cited by examiner

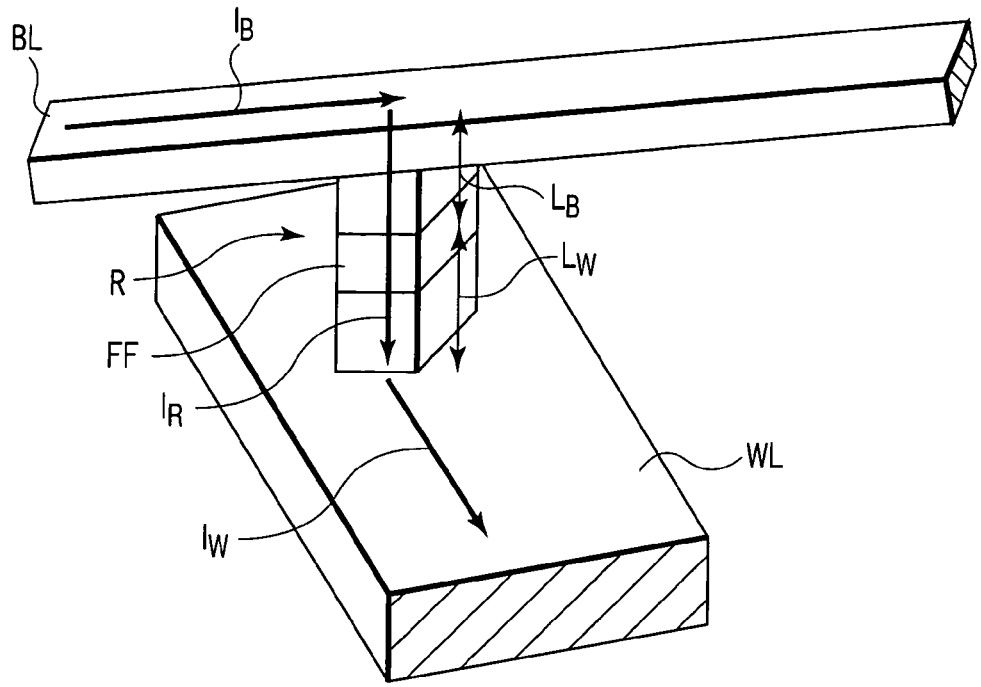
F I G. 52
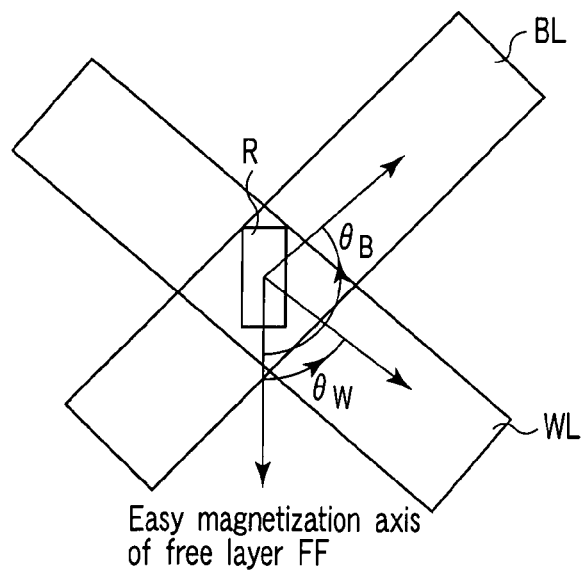
Easy magnetization axis of free layer FF
F I G. 53

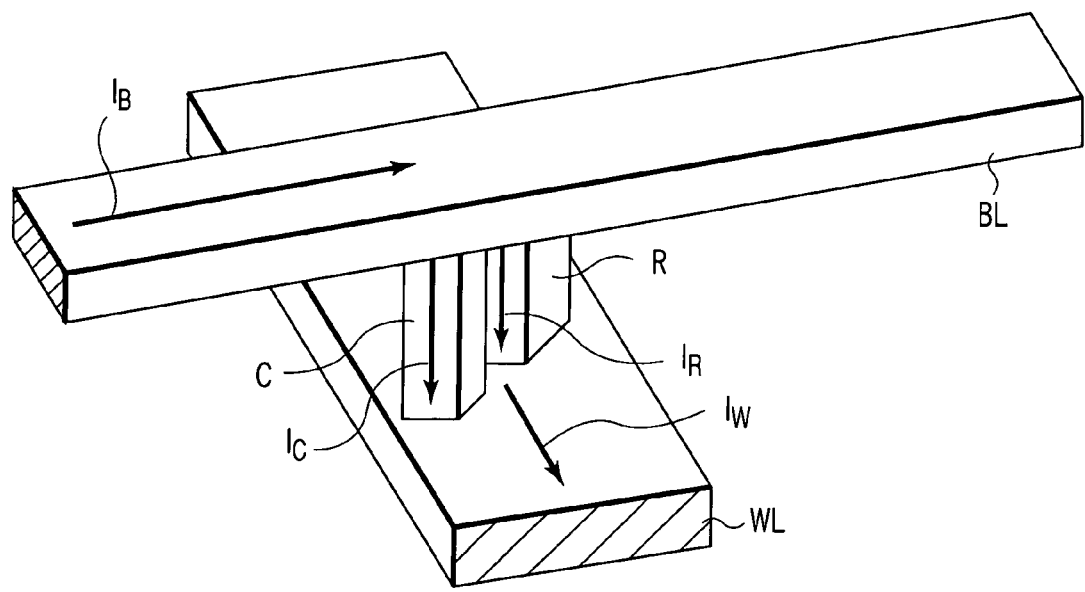
F I G. 57
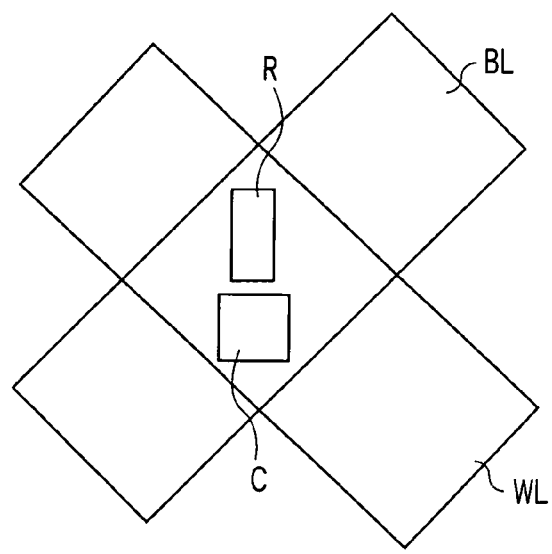
F I G. 58

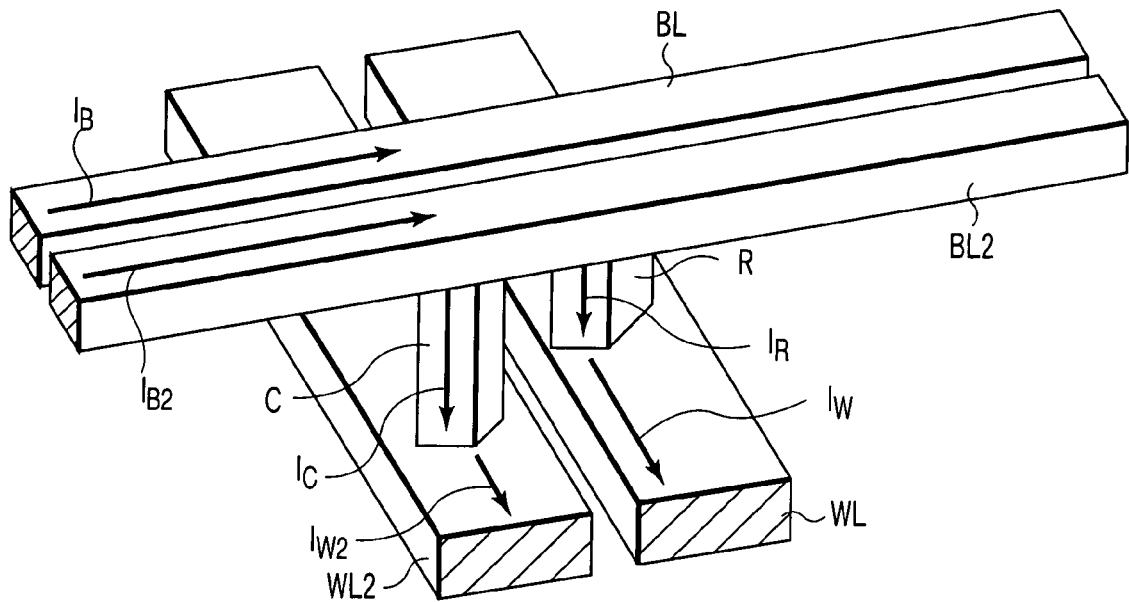
F I G. 63
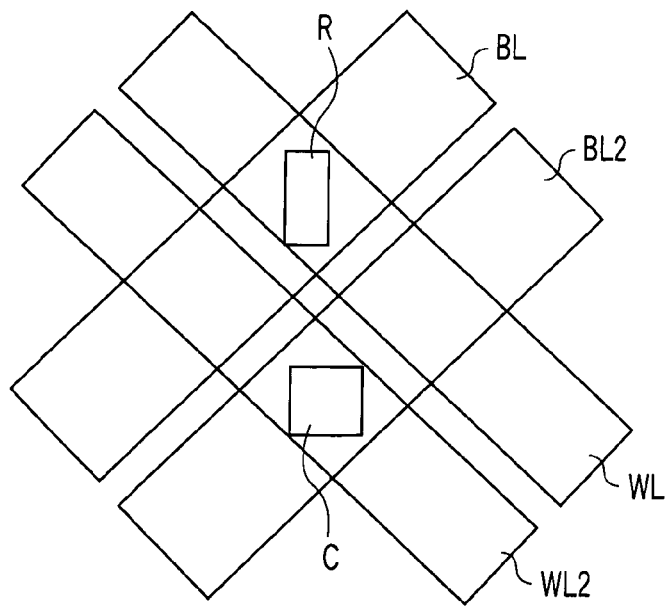
F I G. 64

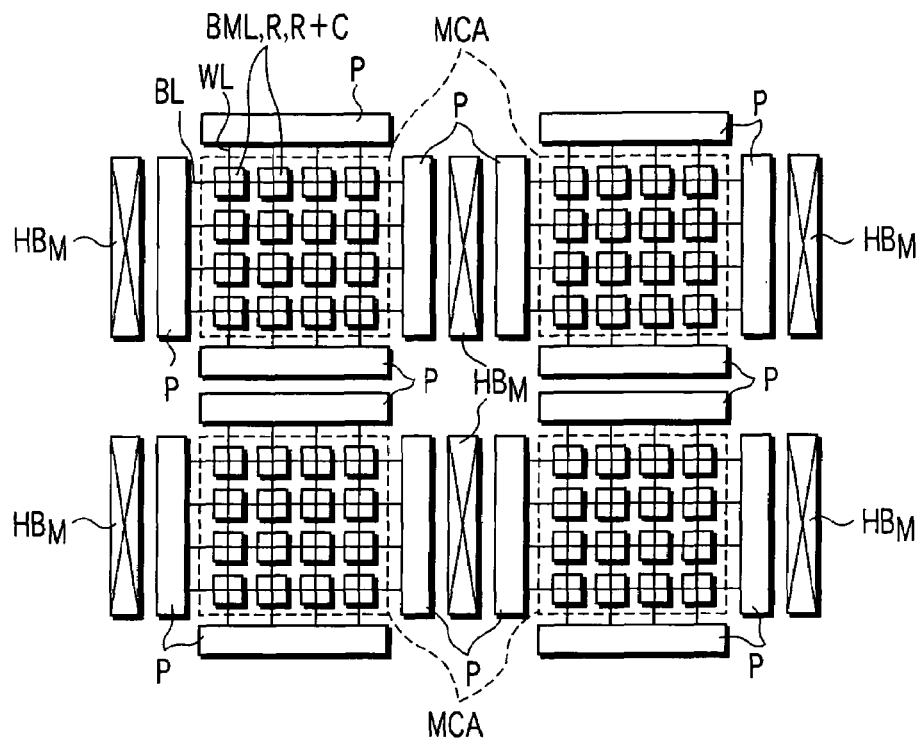
F I G. 69
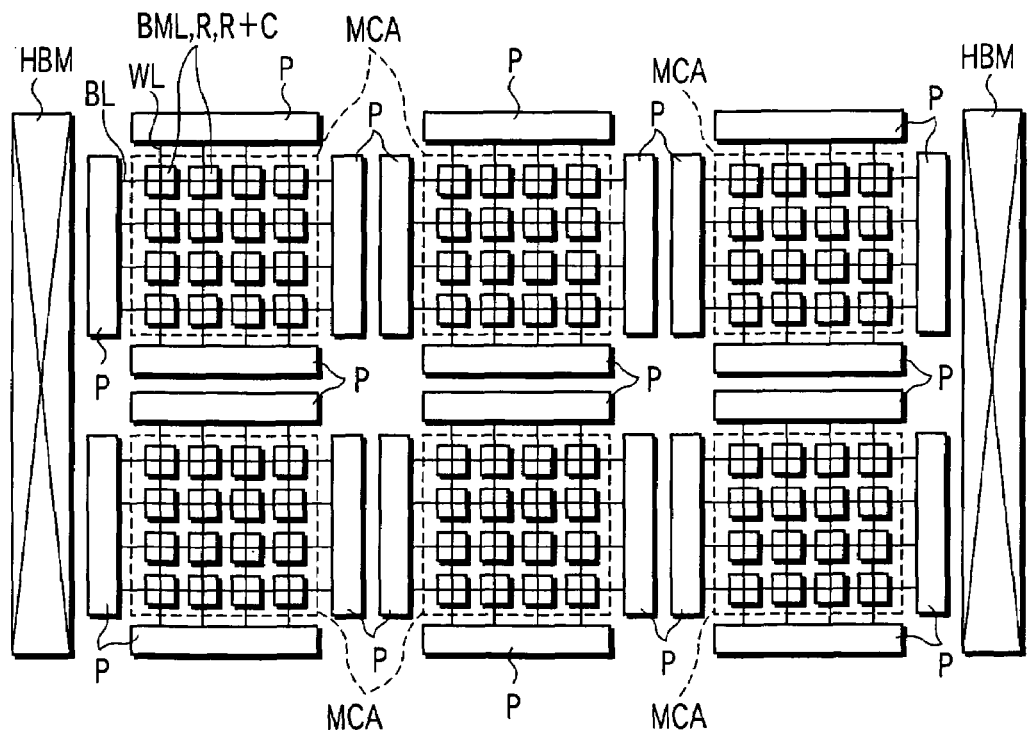
F I G. 70

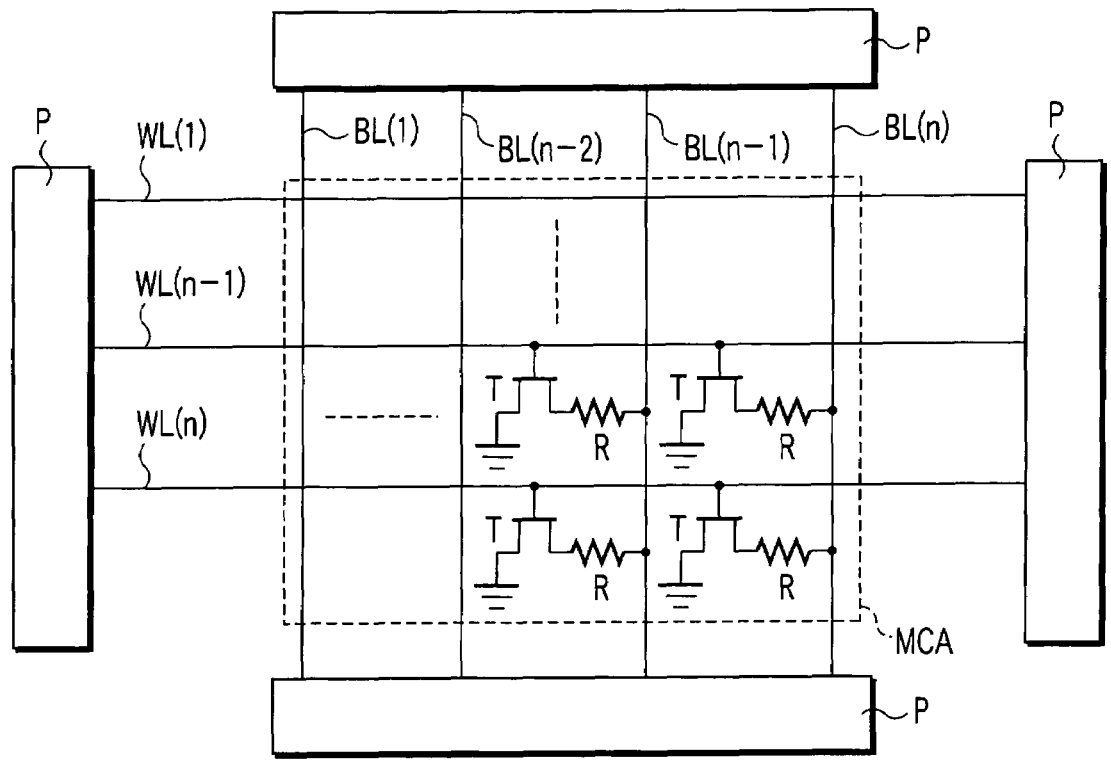
F I G. 71
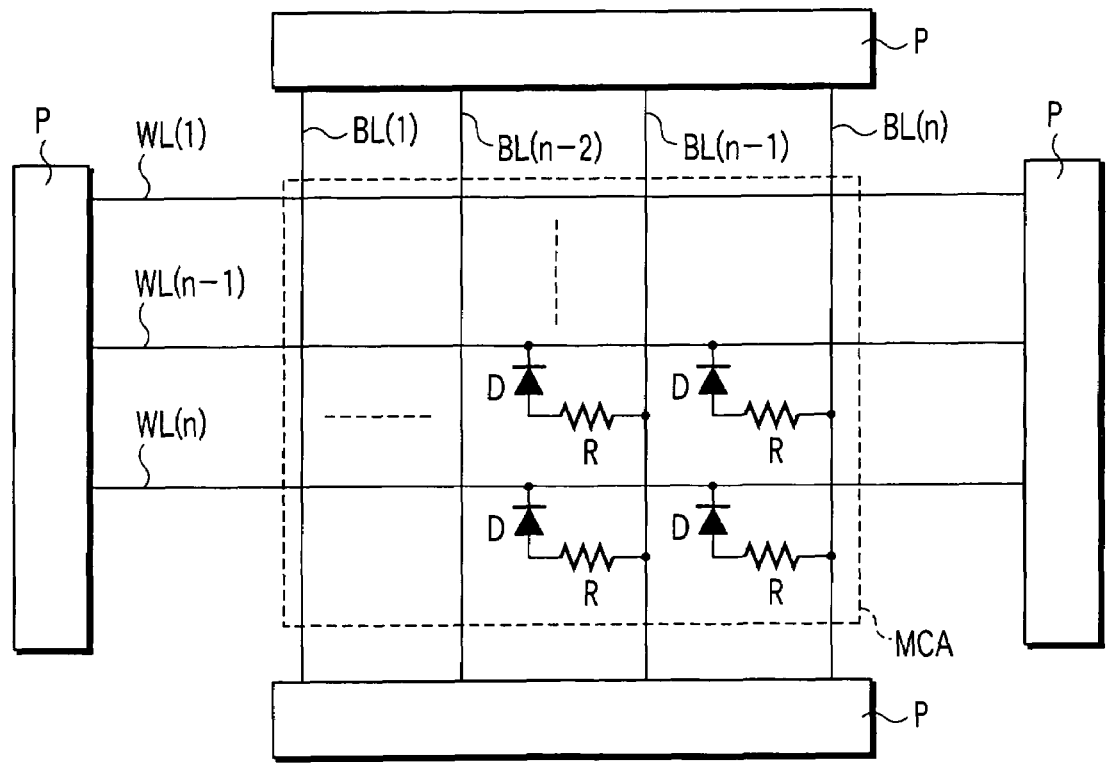
F I G. 72

MAGNETIC RECORDING ELEMENT, MAGNETIC RECORDING APPARATUS AND RECORDING METHOD OF INFORMATION

CROSS-REFERENCE TO RELATED APPLICATIONS

This application is based upon and claims the benefit of priority from prior Japanese Patent Application No. 2004-368190, filed Dec. 20, 2004, the entire contents of which are incorporated herein by reference.

BACKGROUND OF THE INVENTION

1. Field of the Invention

The present invention relates to a magnetic recording element, magnetic recording device and recording method of information, and more particularly to a magnetic recording element capable of controlling the magnetization direction of a magnetic substance by use of the spin-transfer torque so as to record data.

2. Description of the Related Art

Information recording apparatuses have been used to satisfy a variety of demands such as increased capacity, high speed, excellent durability, low cost as an existence which supports wide and highly information age society and leads it in recent years and technology for improving such features has been demanded. Of these components, the magnetic recording device using magnetic moment of a ferromagnetic substance has been used as, for example, a hard disk drive currently and recently, use as a magnetic random access memory (MRAM) having both high speed and nonvolatile performances has been proposed.

However, a demand for high density memory has reached 100 nm to several tens nm or a shorter scale as a unit cell for storing 1-bit data, so that technical barrier is appearing in data writing style. That is, the smaller the memory cell is, the more the current necessary to generate magnetic field for writing in current magnetic field writing style used in hard disk drive or MRAM. Current magnetic field writing style also cannot prevent the cross talk to adjoining cells.

Magnetization switching by use of the spin-transfer torque, which is actually verified in F. J. Albert et al., Appl. Phys. Lett., vol. 77, 3809 (2000), pp. 77 recently, is expected as a new magnetic recording method capable of solving the problems of the current magnetic field writing style.

According to this phenomenon, when flow of spin-polarized electron passes a magnetic substance whose magnetization direction is directed in antiparallel to the electron, spin angular momentum of conduction electron is applied and transmitted to the magnetization of the magnetic substance to generate a torque to switch the magnetization. This phenomenon enables a more direct operation to be applied to a nano scale magnetic substance as compared with magnetization switching by current magnetic field. Thus, no cross talk occurs and high-speed magnetization switching can be expected. Additionally, there is an advantage that the current necessary for writing decreases as the cell size decreases.

However, it is hard to say that the most commonly used magnetization switching by use of the spin-transfer torque sufficiently demonstrates its potential. The current necessary for magnetization switching is extremely large, from 10 mA to several mA even in case where the cell size is 100 nm to several tens nm, so that the device may be damaged and this cannot satisfy the demand for lowered power consumption. Furthermore, it is reported that magnetization switching takes approximately few nano second (see, for example, R. H. Koch et al., Phys. Rev. Lett., vol. 92, 088302, (2004)). A higher speed is demanded for application of exchange of information with a high-speed micro processor.

A conventional magnetization switching method by use of the spin-transfer torque will be described. First, the magnetization switching by use of the spin-transfer torque called a conventional method 1 in this specification will be described. The conventional method 1 shown in FIG. 48 employs a magnetic recording element using a lamination structure constituted of fixed layer FP, intermediate layer S, and free layer FF as its basic structure. The magnetization direction of the free layer FF is parallel to or antiparallel to the magnetization direction of the fixed layer FP. A flow of a current whose strength is higher than a critical value Jc is passed in the vertical direction to the film face of this device (face which respective laid films face) to switch the magnetization. A current 1.5 times larger than the critical value Jc was passed to such a device as simulation. In this simulation, the initial angle of magnetization direction of the free layer FF with respect to the magnetization direction of the fixed layer FP was set to 5 degrees in the film face plane. As a result, time taken for magnetization switching was approximately 7 ns. The smaller the current or the initial angle, the more the switching time takes.

As the magnetization switching method by use of the spin-transfer torque, another method (called conventional method 2) is proposed (Jpn. Pat. Appln. KOKAI Publication No. 2002-261352). The conventional method 2 is carried out by introducing a current which is spin-polarized in a direction perpendicular to the magnetization direction of the free layer. FIG. 49 shows schematically the sectional structure of a recording device used for the conventional method 2. This device has a lamination structure constituted of spin supply layer FPW, intermediate layer SW, free layer FF, intermediate layer SR and fixed layer FPR and the magnetization of the spin supply layer FPW is perpendicular to the film face.

As the current keeps supplied to such a device, the magnetization of the free layer FF executes precessional motion. If the injection of the current is stopped, the magnetization stops its processional motion and approaches to the final state which is dependent on the time-width of the supplying current. That is, if an introduction of a current is stopped at a time t1, the magnetization is switched from the initial condition to the opposite one. A. D. Kent et al., Appl. Phys. Lett., vol. 84, 3897 (2004) states that magnetization switching is possible at 50 ps by using the substantially same method. However, a slight shift of the stop timing of the current from t1 causes the magnetization direction to return to the initial state. Thus, in this method, accurate control of the time for supplying current is required as well as the suppression of the variation of the magnetization direction in each device. Further, because such magnetization switching depends on the initial state, the read-before-write is necessary.

In summary, the current technology of the magnetization switching by use of the spin-transfer is not sufficient in light of current consumption and high-speed characteristics. Although the conventional method 2 is principally capable of high speed magnetization switching, it is needed to suppress the variation of magnetization direction among elements and accurately control the time for the current supply.

BRIEF SUMMARY OF THE INVENTION

According to a first aspect of the present invention, there is provided a magnetic recording element comprising: a magnetic recording element comprising: a first fixed layer having a first face and a second face opposing each other and having a magnetization direction fixed in a direction penetrating the first face and the second face; a free layer having a third face and a fourth face opposing each other, having anisotropy field having a first value magnitude, having a magnetization easy axis and a magnetization hard axis both extending along the third face or the fourth face, and having a magnetization direction which changes according to a direction of a current flowing through the first face and the fourth face with a magnetic field applied to the free layer in a fixed direction or according to a direction of a magnetic field applied to the free layer with a current flowing through the first face and the fourth face in a fixed direction; a first intermediate layer consisting essentially of nonmagnetic material and provided between the second face and the third face; and a magnetic field generating layer configured to apply a magnetic field having magnitude smaller than the first value to the free layer along the magnetization hard axis.

According to a second aspect of the present invention, there is provided a magnetic recording device including a memory array in which magnetic recording elements are disposed in matrix, the magnetic recording element comprising: a first fixed layer having a first face and a second face opposing each other and having a magnetization direction fixed in a direction penetrating the first face and the second face; a free layer having a third face and a fourth face opposing each other, having anisotropy field having a first value magnitude, having a magnetization easy axis and a magnetization hard axis both extending along the third face or the fourth face, and having a magnetization direction which changes according to a direction of a current flowing through the first face and the fourth face with a magnetic field applied to the free layer in a fixed direction or according to a direction of a magnetic field applied to the free layer with a current flowing through the first face and the fourth face in a fixed direction; a first intermediate layer consisting essentially of nonmagnetic material and provided between the second face and the third face; and a magnetic field generating layer configured to apply a magnetic field having magnitude smaller than the first value to the free layer along the magnetization hard axis.

According to a third aspect of the present invention, there is provided an information recording method to a magnetic recording element which comprises a fixed layer, a free layer and a intermediate layer, the fixed layer having a first face and a second face opposing each other and having a magnetization direction fixed in a direction penetrating the first face and the second face, the free layer having a third face and a fourth face opposing each other, having anisotropy field having a first value magnitude, and having a magnetization easy axis and a magnetization hard axis both extending along the third face or the fourth face, the intermediate layer consisting essentially of nonmagnetic material and provided between the second face and the third face, the method comprising: applying a first magnetic field to the free layer along the magnetization hard axis of the free layer, the first magnetic field having magnitude smaller than anisotropy field of the free layer; and conducting application of a second magnetic field to the free layer and introduction of a first current in a direction penetrating the first face and the fourth face while the first magnetic field being applied to the free layer, a direction of the second magnetic field being fixed and the first current flowing in a direction according to a required direction of a magnetization of the free layer or the first current flowing in a fixed direction and a direction of the second magnetic field varying according to a required direction of a magnetization of the free layer.

BRIEF DESCRIPTION OF THE SEVERAL VIEWS OF THE DRAWING

FIG. 52 is a perspective view showing schematically a memory cell according to a third embodiment;

FIG. 53 is a top view of a memory cell according to a third embodiment;

FIG. 57 is a perspective view showing schematically one of the memory cells according to the fifth embodiment;

FIG. 58 is a top view of FIG. 57;

FIG. 63 is a perspective view showing schematically one of the memory cells according to the fifth embodiment;

FIG. 64 is a top view of FIG. 63;

FIGS. 65, 66, 67, 68, 69 and 70 are top views showing schematically one of the magnetic recording device according to the sixth embodiment;

FIGS. 71 and 72 are schematic diagrams showing a magnetic recording device according to the sixth embodiment.

DETAILED DESCRIPTION OF THE INVENTION

Figure 1:
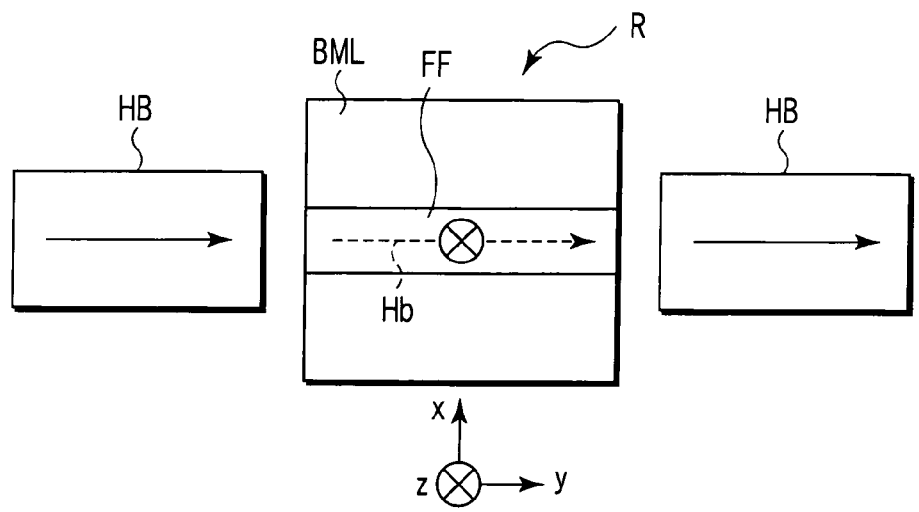
FIG. 1 is a schematic diagram showing the sectional structure of a magnetic recording element according to a first embodiment.

Hereinafter, the embodiments of the present invention will be described with reference to the accompanying drawings. Like reference numerals are attached to components having substantially the same function and structure and description thereof is omitted except when required particularly.

(1) FIRST EMBODIMENT

[1-1] Structure

FIG. 1 is a schematic diagram showing the sectional structure of a magnetic recording element according to the first embodiment of the present invention. This magnetic recording element R comprises a lamination film BML called basic lamination film hereinafter below and hard bias layer (magnetic field generation layer) HB disposed near the basic lamination film BML. The hard bias layer HB and the basic lamination film BML are preferred to be insulated from each other magnetically and electrically with a nonmagnetic insulation film sandwiched thereby.

Figure 2:
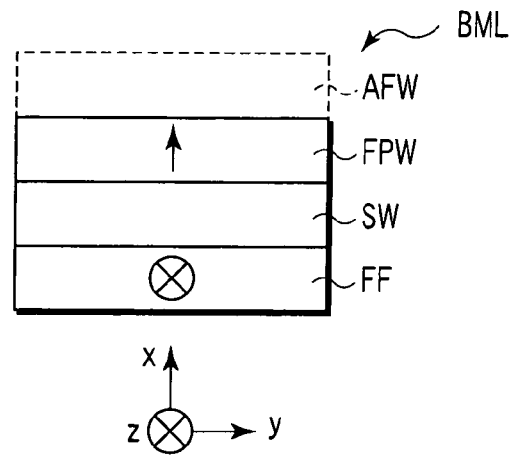
FIGS. 2, 3, 4 and 5 are schematic diagrams showing an example of the structure of basic lamination film.
Figure 3:
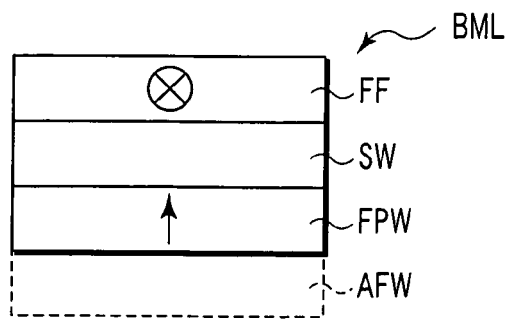
Figure 4:
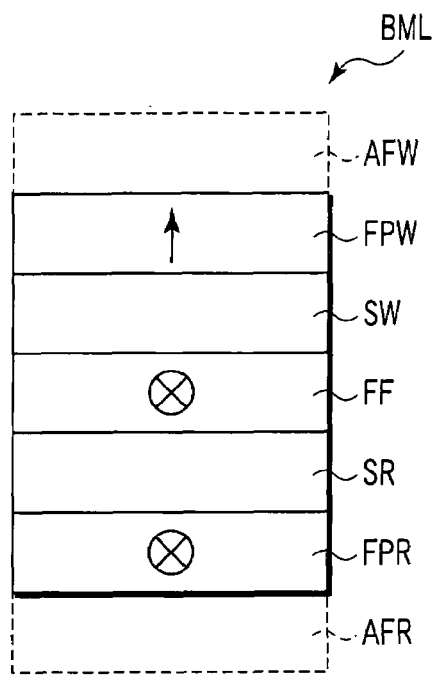
Figure 5:
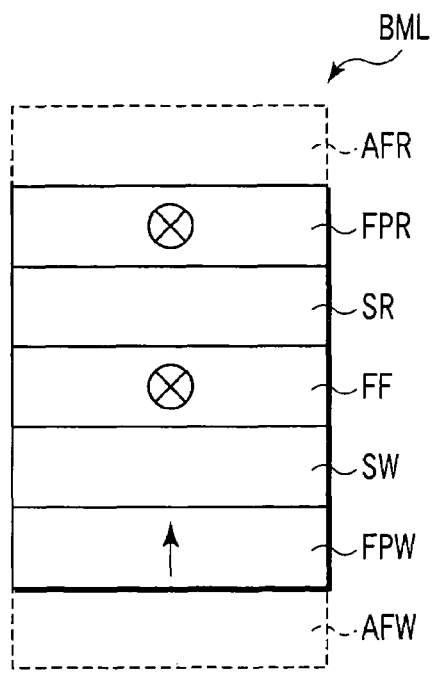

The basic lamination film BML contains ferromagnetic layer FF and more specifically, has a sectional structure expressed schematically by any one of FIGS. 2 to 5. In a description below, it is assumed that the film face of the basic lamination film BML spreads along z-y plane of a space composed of x-axis, y-axis and z-axis intersecting mutually. As shown in FIG. 2 or 3, in the basic lamination film BML, ferromagnetic layer FPW, intermediate layer SW, and ferromagnetic layer FF are laid in this order. Alternatively, as shown in FIG. 4 or 5, the ferromagnetic layer FPW, the intermediate layer SW, the ferromagnetic layer FF, the intermediate layer SR and the ferromagnetic layer FPR are laid in this order. In the meanwhile, the ferromagnetic layer FPW, the ferromagnetic layer FF and the ferromagnetic layer FPR may be formed in a lamination structure composed of sublayers described later. However, description below is based on an assumption that the ferromagnetic layers FPW, FF, FPR are a single layer.

The magnetization direction of the ferromagnetic layer FPW is fixed. This can be performed by providing antiferromagnetic layer AFW on a face on an opposite side to the intermediate layer SW of the ferromagnetic layer FPW. Alternatively, this can be performed by using a magnetic material whose anisotropy constant Ku is very large for the ferromagnetic layer FPW. Hereinafter the ferromagnetic layer FPW is referred to as first fixed layer.

The magnetization direction of the first fixed layer FPW is a direction satisfying the following conditions. In case of writing according to a conventional method 2, the magnetization direction of a spin supply layer FPW is not necessarily perpendicular to film face and a component in a direction perpendicular to the magnetization plane of the spin supply layer FPW contributes to the writing. Thus, at least the magnetization direction of the first fixed layer FPW needs to be in such a direction that its x-axis component is large enough to allow current (described later) flowing in a direction passing the film face of the basic lamination film BML to switch the magnetization direction of the ferromagnetic layer FF. Thus, the magnetization direction of the first fixed layer FPW is at least in a direction of penetrating two films faces of the first fixed layer FPW. More specifically, the magnetization direction of the first fixed layer FPW is within ±30° from the x-axis and typically, is parallel to the x-axis (perpendicular to y-z plane). Here, the "perpendicular" mentioned in this specification includes a slight shift from strict perpendicular which may occur in manufacturing process. Likewise, "parallel" in this specification does not mean a strict parallel.

In contrast, such a fixing mechanism is not provided for the magnetization direction of the ferromagnetic layer FF. Thus, the magnetization direction of the ferromagnetic layer FF changes. Hereinafter, the ferromagnetic layer FF is called free layer. The magnetization easy axis of the free layer FF is directed along a film face (y-z plane). However, like the first fixed layer FPW, the magnetization direction of the free layer FF does not need to be strictly parallel to the y-z plane. That is, the easy magnetization axis of the free layer FF only needs to be in a direction to allow current passing the film face of the basic lamination film BML to switch the magnetization direction of the free layer FF with the x-axis component of the magnetization direction of the first fixed layer FPW taken into consideration. Thus, there is no problem even if the magnetization direction of the free layer FF tilts slightly from the z-y plane because of deviations in manufacturing process.

The magnetization direction of the ferromagnetic layer FPR is fixed. This can be carried out by providing an antiferromagnetic layer AFR in an opposite side to the intermediate layer SR of the ferromagnetic layer FPR. Hereinafter, the ferromagnetic layer FPR is called second fixed layer. The magnetization direction of the second fixed layer FPR is along the easy magnetization axis of the free layer FF. Here, the magnetization direction of the second fixed layer FPR and the easy magnetization axis of the free layer FF do not need to be along a strictly same direction. That is, the magnetization direction of the second fixed layer FPR only needs to be in a direction which enables information to be read out from the basic lamination film BML using magnetoresistance with a mutual relation of the free layer FF to the magnetization direction taken into consideration.

The intermediate layer SW is composed of nonmagnetic material and needs to thick enough to separate the fixed layer FPW and the free layer FF to an extent that direct interaction between the fixed layer FPW and the free layer FF can be neglected. At the same time, the intermediate layer SW needs to be thinner than the spin diffusion length because the spin direction of electron needs to stay unchanged until conduction electron passing the fixed layer FPW reaches the free layer FF when current is introduced in the element.

Likewise, the intermediate layer SR needs to be thick enough to separate the fixed layer FPR and the free layer FF to such an extent that direct interaction between the fixed layer FPR and the free layer FF can be neglected. At the same time, the intermediate layer SW needs to be thinner than the spin diffusion length because the spin direction of electron needs to stay unchanged until conduction electron passing the fixed layer FPR reaches the free layer FF when current is introduced in the element. As the intermediate layer SW and the intermediate layer SR, nonmagnetic metal, nonmagnetic semiconductor, insulation film and the like may be used.

As for hard bias layer HB, its magnetization direction is fixed in a direction perpendicular to the easy magnetization axis of the free layer FF in the y-z plane, or magnetization hard axis. A bias magnetic field $H_b$ in the y direction is applied to the free layer FF by the hard bias layer HB. However, this direction is a most typical example and the magnetization direction of the hard bias layer HB is not limited to this direction if the y direction component of the magnetization direction of the hard bias layer HB acts on the free layer FF under a condition described later. Therefore, it may have an angle to the y-z plane or an angle to the y-axis. The bias magnetic field $H_b$ needs to be smaller than the anisotropy field of the free layer FF because too large bias magnetic field $H_b$ may set the magnetization of the free layer FF along the hard magnetization axis. However, an effect, which this embodiment intends to secure, cannot be expected if the bias magnetic field $H_b$ is too small. Therefore, the magnitude of the bias magnetic field $H_b$ needs to be within an upper limit and lower limit. An optimum range of the magnitude of the bias magnetic filed $H_b$ will be described in sections for writing and reading later.

This device is manufactured using sputtering technology and lithography technology. The details will be descried in sections of embodiments.

[1-2] Writing and Reading

A method for writing and reading of data in the magnetic recording element R described in [1-1] will be described. To simplify a description below, it is assumed that the magnetization direction of the first fixed layer FPW is directed along the x-axis, the magnetization easy axis of the free layer FF and the magnetization direction of the second fixed layer FPR are directed along the z-axis and the bias magnetic field $H_b$ is directed along the y-axis. Although the magnetization direction of the first fixed layer FPW may be directed along +x direction or −x direction, a case of +x direction will be explained here. Further, although the direction of the bias magnetic field $H_b$ may be directed along +y direction or −y direction, a case of +y direction will be described here. The writing method is equal regardless of whether the basic lamination film BML adopts any structure in FIGS. 2 to 5.

Figure 6:
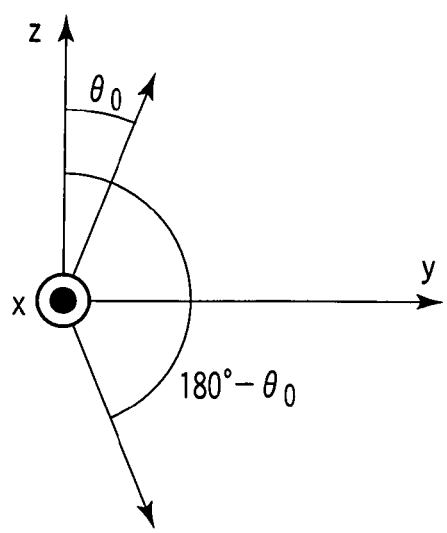
FIG. 6 is a diagram showing the magnetization direction of a free layer along y-z plane.

FIG. 6 shows the magnetization direction of the free layer FF along the y-z plane. If there is no influence of the bias magnetic field $H_b$ before and after current is supplied, as shown in FIG. 6, the magnetization of the free layer FF is stable along +z direction or −z direction. If the bias magnetic field $H_b$ larger than the anisotropy field $H_k$ of the free layer FF is applied thereto in the magnetization hard axis, the stabilization direction of magnetization of the free layer FF becomes a direction turned by an angle θ within the film face. That is, the magnetization of the free layer is stable when an angle from +z direction θ is $\theta_0°$ or $180-\theta_0°$. Note that $\theta_0$ falls within a range of 0° between 90°. Here, there is a relation of $\sin\theta_0 = H_b/H_k$. To obtain a sufficiently large reading efficiency or prevent unexpected magnetization switching due to heat swing, $\theta_0$ is preferred to be less than 45°. That is, it is preferred that $|H_b| \leq 0.7|H_k|$.

To switch the magnetization direction of the free layer FF, electron flow is passed in a direction that passes two film faces of the free layer FF. More specifically, to switch it from a direction of $\theta_0°$ to a direction of an angle $(180-\theta_0°)$, electrons are made to flow from the free layer FF toward the fixed layer FPW. Conversely, to switch the magnetization of the free layer FF from the angle of $(180-\theta_0°)$ to the angle $\theta_0°$, electrons are made to flow form the fixed layer FPW toward the free layer FF.

Figure 7:
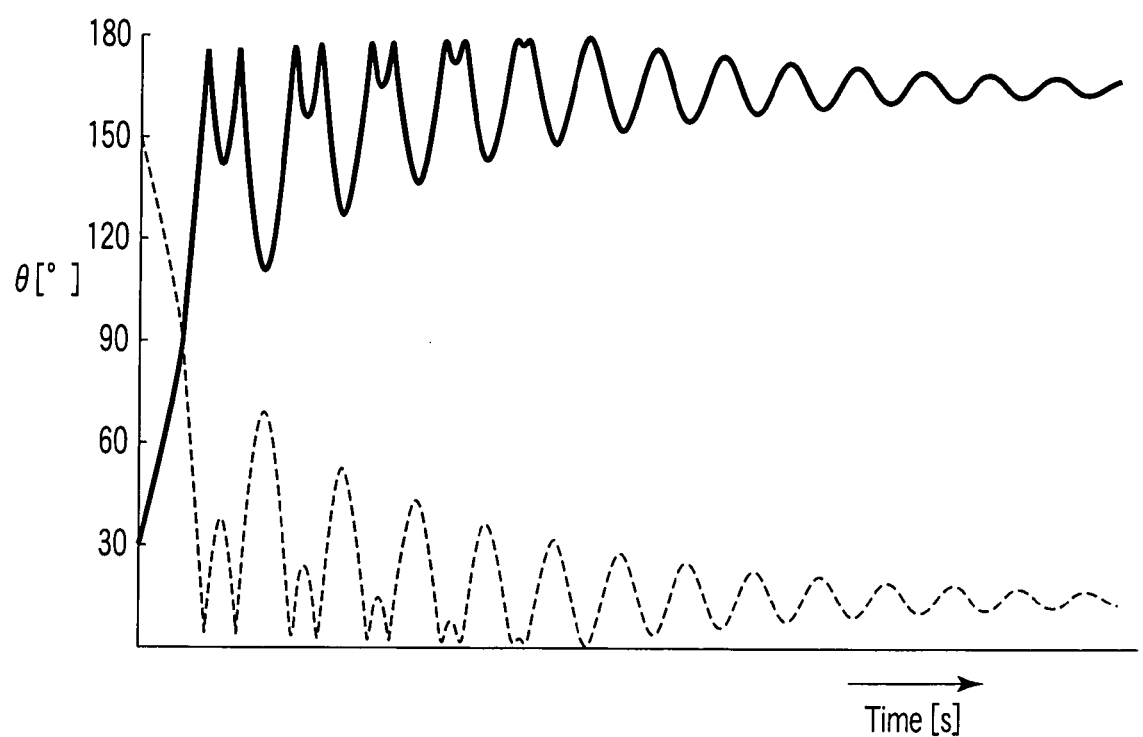
FIG. 7 is a diagram showing an example of changes of an angle θ in the magnetization direction of the free layer with a time passage according to a first embodiment.

A simulation result shown in FIG. 7 shows that the magnetization is switched by this method. FIG. 7 shows an example of changes in the angle θ of the magnetization of the free layer FF with a time passage. In this example, the magnitude of the bias magnetic field $H_b$ is set 50% anisotropy field and the magnitude of current to be introduced is set 50% critical current Jc in a conventional method 1. The solid line in FIG. 7 expresses changes of angle in case where electrons are made to flow from the fixed layer FPW toward the free layer FF and the broken line shows changes of angle in case where the electrons are made to flow from the free layer FF to the fixed layer FPW. From FIG. 7 confirms that this embodiment can cause magnetization switching. Additionally, not only reduction in current is achieved as compared with the conventional method 1 but also swift magnetization switching is achieved and it takes about 0.2 ns for the magnetization switching. Further, as compared with the conventional method 2, current introduction time does not need to be controlled highly accurately because magnetization vibration damps. Further, read-before-write is not necessary because the magnetization switching does not depend on an initial state.

Next, range of bias magnetic field and current optimum for writing will be described. In Landau-Lifschitz-Gilbert equation made dimensionless, $$dm/dt = -\alpha m \times dm/dt + \gamma H_K m \times h_{\mathit{eff}}$$

$$h_{\mathit{eff}} = (-2m_x/k, h-jm_z, m_z+jm_y)$$

Evidently, parameters, which feature this system, are as follows.

$$k \equiv \frac{H_K}{2\pi M}$$

$$h \equiv \frac{H_b}{H_K}$$

$$j \equiv \frac{\hbar g I_e}{|e| M V H_K}$$

where:
α: damping factor
γ: gyromagnetic ratio
t: time
e: charge of electron
Ie: volume of free layer
g: torque efficiency factor (dimensionless quantity)

Meanwhile, g is mentioned in J. C. Slonczewski, J. Magn. Magn. Matr., 159, L1 (1996).

As for material used for the free layer FF, material whose saturation magnetization M is large and whose anisotropy field $H_k$ is small has a small k and material whose saturation magnetization M is small and whose anisotropy $H_k$ is large has a large k. For example, a material whose anisotropy field $H_k$ is not so large like Co has small k value, about 0.02. A material whose anisotropy field $H_k$ is large like FePt has large k value, about 25.

Figure 8:
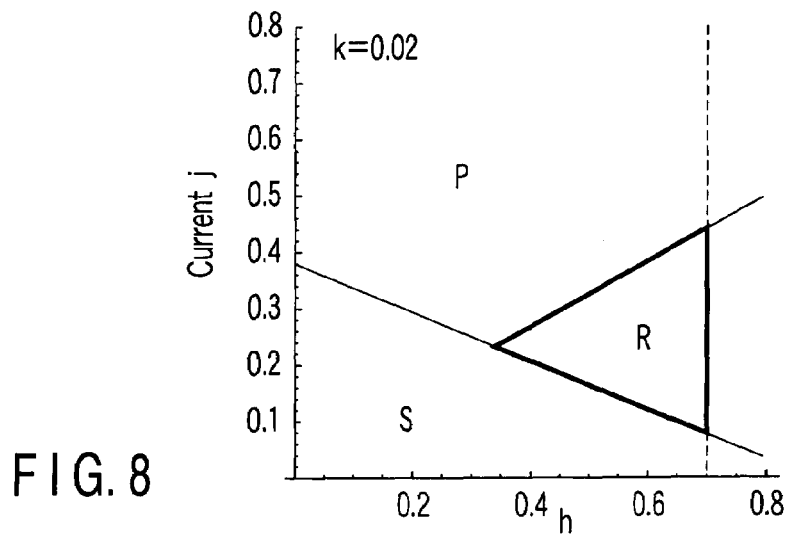
FIGS. 8, 9 and 10 are phase diagrams of dynamic behavior in the magnetization direction when bias magnetic field and the magnitude of current are changed.
Figure 9:
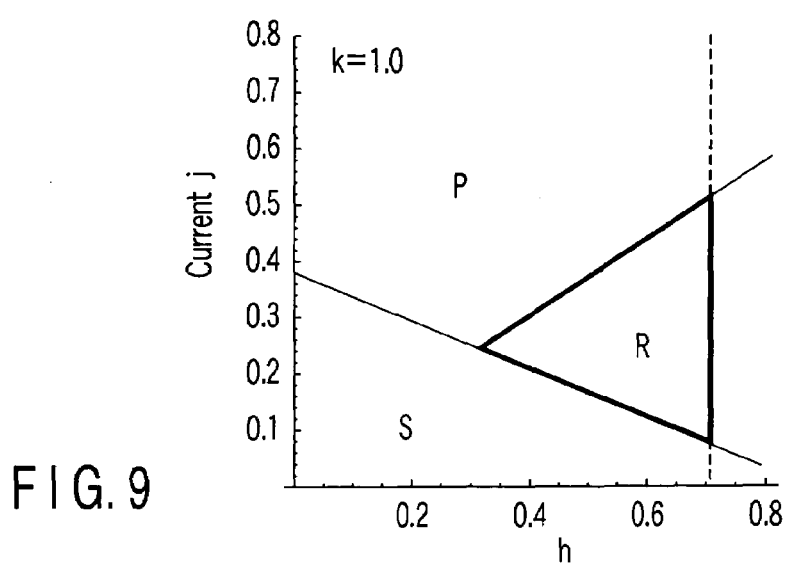
Figure 10:
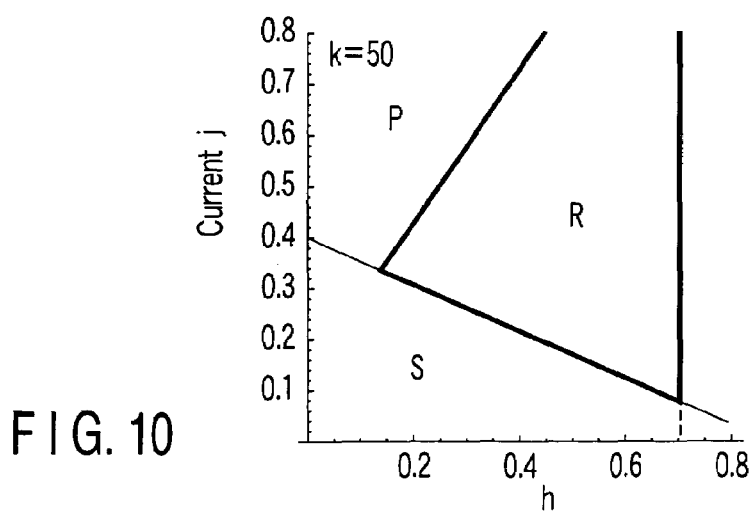

FIGS. 8, 9 and 10 are phase diagrams which shows the types of the dynamic behavior of the magnetization for the case where k=0.02, 1, 50, respectively. In each phase diagram, the magnitude of the bias magnetic field and that of the current are changed. The current and bias magnetic field are expressed as dimensionless quantities j, h, respectively. The dynamic behavior of magnetization when current is introduced with bias magnetic field applied are classified to three types, (R) reversal, (S) staying around the initial direction and (P) precessional motion. That is, in each of FIGS. 8, 9 and 10, a region R indicates the magnitude of current and the range of bias magnetic field strength, which enable this embodiment to be carried out.

Among the points in the region R, a smaller value of j is preferable. In addition, a smaller value of h is also preferable since the angle $\theta_0$ is smaller in that case.

If the magnetization direction of the first fixed layer FPW is −x direction and the direction of the bias magnetic field $H_b$ is +y direction, magnetization switching can be executed by injecting current in the opposite direction to the direction mentioned above.

Further, If the magnetization direction of the first fixed layer FPW is +x direction and the direction of the bias magnetic field $H_b$ is −y direction, likewise, magnetization switching can be executed by injecting current in the opposite direction to the direction mentioned above.

If the magnetization direction of the first fixed layer FPW is −x direction and the direction of the bias magnetic field $H_b$ is −y direction, likewise, the magnetization switching can be executed by injecting a current in the same direction as the direction mentioned above.

If the basic lamination film BML has the structure shown in FIG. 4 or 5, data stored in the magnetization direction of the free layer FF can be read out using the magnetoresistance. That is, if the magnetization direction of the free layer FF is parallel to the magnetization direction of the fixed layer FPR when a sense current having an intensity smaller than switching current is introduced in between the free layer FF and the fixed layer FPR, magnetoresistance is relatively small and if it is not parallel, magnetoresistance is relatively large.

[1-3] Modification of Structure

FIGS. 11 to 40 show schematically the sectional view of a structure applicable to the first fixed layer FPW, the free layer FF and the second fixed layer FPR. Arrows in each sub-layer of FIGS. 11 to 40 indicate the directions of the magnetization. The magnetization direction of each sub-layer of FIGS. 11 to 25 has the same feature as that of the magnetization direction possessed by the free layer FF and the second fixed layer FPR and is typically directed along the z-axis. Further, the magnetization direction of each sub-layer of FIGS. 26 to 40 has the same feature as that of the magnetization direction possessed by the first fixed layer FPW and is typically directed along the x-axis. Any structure shown in FIGS. 11 to 25 can be applied to the free layer FF and the second fixed layer FPR. Any structure shown in FIGS. 26 to 40 can be applied to the first fixed layer FPW. Ferromagnetic subs-layer constituting the fixed layers FPW, FPR and the free layer FF may have a structure in which some ferromagnetic films are overlaid. That is, the fixed layers FPW, FPR and the fixed layer FF are ferromagnetic single-layer film or multilayer film in which two or more ferromagnetic bodies are overlaid or multilayer film in which ferromagnetic or nonmagnetic sub-layers are overlaid.

Figure 40:
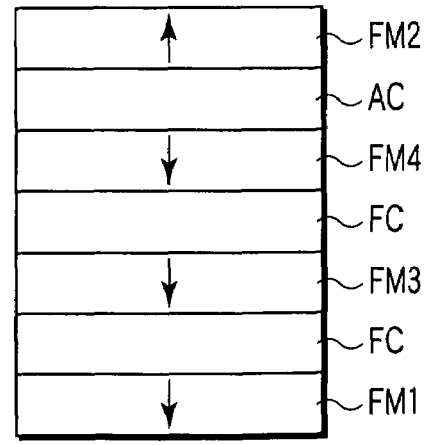
Figure 41:
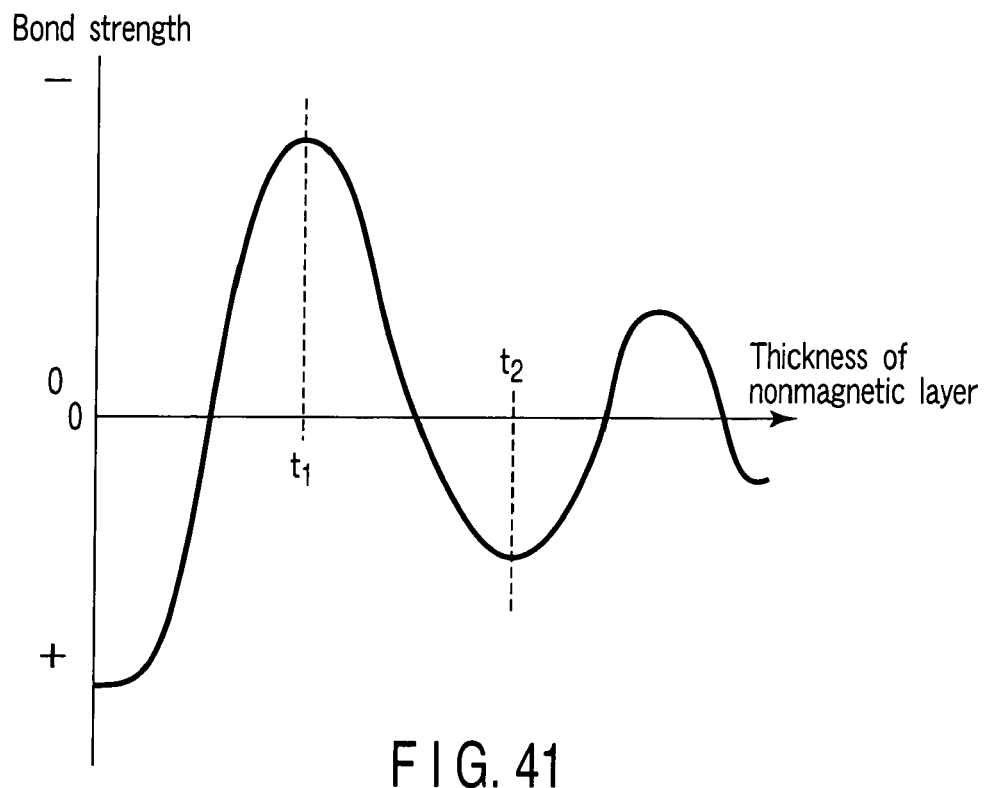
FIG. 41 is a diagram showing the relation between the thickness of nonmagnetic layer and bonding force between two ferromagnetic layers sandwiching this nonmagnetic layer.

Generally, exchange coupling between two ferromagnetic layers via nonmagnetic layer vibrates between positive and negative values according to the thickness of the nonmagnetic layer as schematically shown in FIG. 41. Therefore, the film thickness of the nonmagnetic sub-layer in FIGS. 12 to 25, 27 to 40 is set to any positive or negative peak position in FIG. 41, then the exchange coupling between the ferromagnetic sub-layers adjacent on both sides thereof can be set to ferromagnetic or antiferromagnetic. In FIGS. 12 to 25 and 27 to 40, the nonmagnetic sub-layer FC has a feature of connecting ferromagnetic sub-layers adjacent on both sides feromagnetically and its film thickness is adjusted to t2 in FIG. 41. The nonmagnetic sub-layer AC has a feature of connecting the ferromagnetic sub-layers adjacent on both sides antiferromagnetically and its film thickness is adjusted to t1 in FIG. 41.

Figure 11:
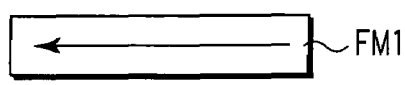
FIGS. 11, 12, 13, 14, 15, 16, 17, 18, 19, 20, 21, 22, 23, 24, 25, 26, 27, 28, 29, 30, 31, 32, 33, 34, 35, 36, 37, 38, 39 and 40 are schematic diagrams showing the section of a structure applicable to a fixed layer and free layer.
Figure 26:

In the structure of FIGS. 11 and 26, only a single ferromagnetic sub-layer FM1 is provided. FIGS. 12 to 18 and 27 to 33 show that top ferromagnetic sub-layer FM1 and bottom ferromagnetic sub-layer FM2 are ferromagnetically exchange-coupled.

Figure 12:
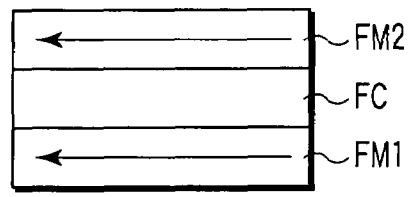
Figure 27:
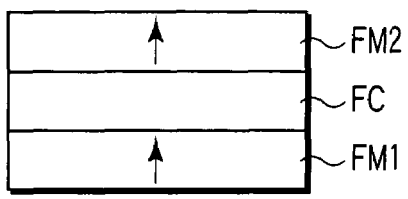

In the structure of FIGS. 12 and 27, a nonmagnetic sub-layer FC is provided between the bottom ferromagnetic sub-layer FM1 and the top ferromagnetic sub-layer FM2. The ferromagnetic sub-layer FM1 is ferromagneticaly coupled to the ferromagnetic sub-layer FM2.

Figure 13:
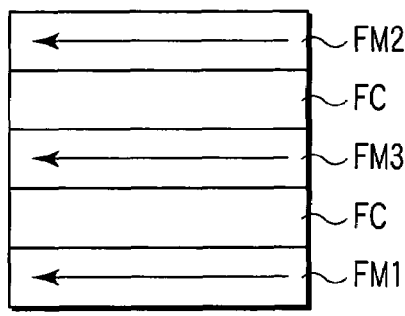
Figure 28:
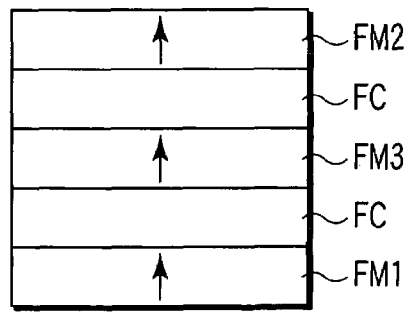

In the structure of FIGS. 13 and 28, nonmagnetic sub-layer FC, ferromagnetic sub-layer FM3 and nonmagnetic sub-layer FC are stacked in order from the bottom between the ferromagnetic sub-layers FM1 and FM2. The ferromagnetic sub-layer FM3 is ferromagnetically coupled to the ferromagnetic sub-layers FM1, FM2.

Figure 14:
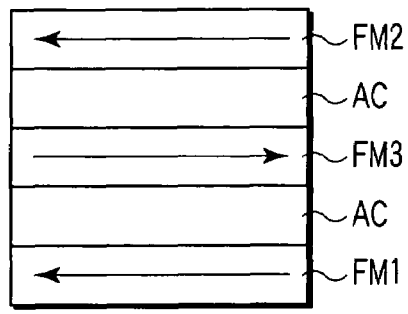
Figure 29:
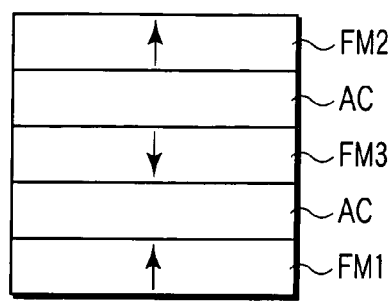

In the structure of FIGS. 14 and 29, nonmagnetic sub-layer AC, ferromagnetic sub-layer FM3 and nonmagnetic sub-layer AC are stacked in order from the bottom between the ferromagnetic sub-layers FM1 and FM2. The ferromagnetic sub-layer FM3 is antiferromagnetically coupled to the ferromagnetic sub-layers FM1, FM2.

Figure 15:
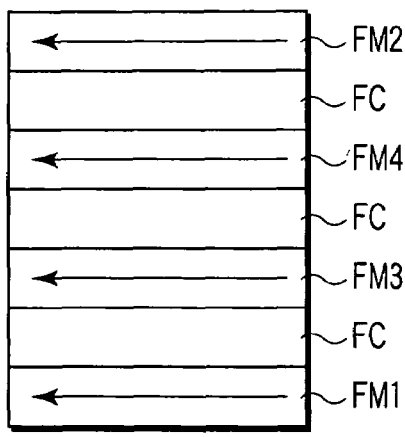
Figure 30:
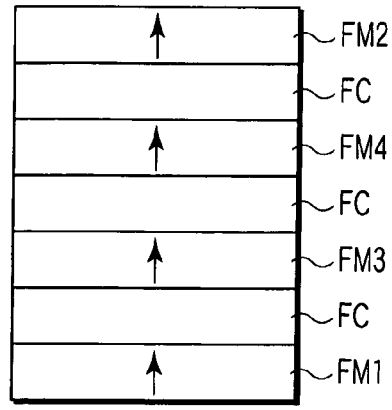

In the structure of FIGS. 15 and 30, nonmagnetic sub-layer FC, ferromagnetic sub-layer FM3, nonmagnetic sub-layer FC, ferromagnetic sub-layer FM4, and nonmagnetic sub-layer FC are stacked in order from the bottom between the ferromagnetic sub-layers FM1 and FM2. The ferromagnetic sub-layer FM3 is ferromagnetically coupled to the ferromagnetic sub-layers FM1, FM4 and the ferromagnetic sub-layer FM4 is ferromagnetically coupled to the ferromagnetic sub-layer FM2.

Figure 16:
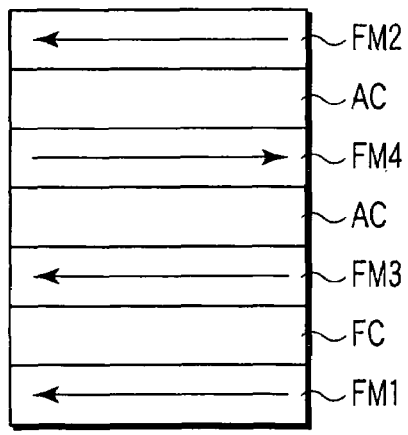
Figure 31:
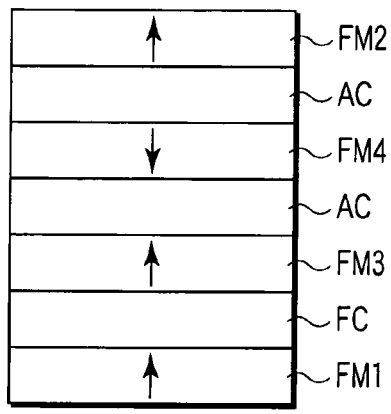

In the structure of FIGS. 16 and 31, nonmagnetic sub-layer FC, ferromagnetic sub-layer FM3, nonmagnetic sub-layer AC, ferromagnetic sub-layer FM4, and nonmagnetic sub-layer AC are stacked in order from the bottom between the ferromagnetic sub-layers FM1 and FM2. The ferromagnetic sub-layer FM3 is ferromagnetically coupled to the ferromagnetic sub-layer FM1. The ferromagnetic sub-layer FM4 is antiferromagnetically coupled to the ferromagnetic sub-layers FM2, FM3.

Figure 17:
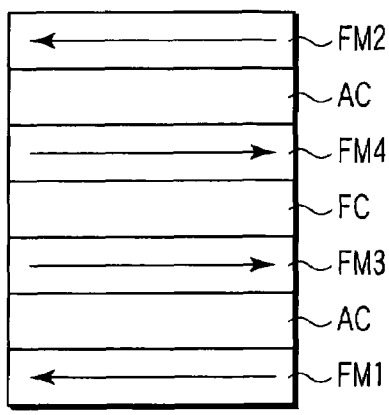
Figure 32:
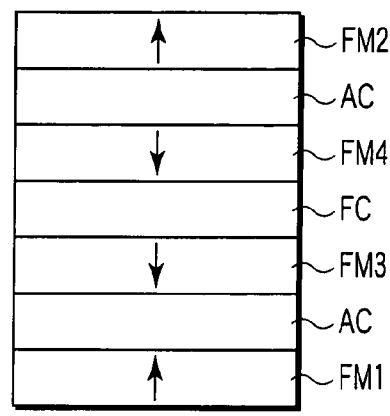

In the structure of FIGS. 17 and 32, nonmagnetic sub-layer AC, ferromagnetic sub-layer FM3, nonmagnetic sub-layer FC, ferromagnetic sub-layer FM4, and nonmagnetic sub-layer AC are stacked in order from the bottom between the ferromagnetic sub-layers FM1 and FM2. The ferromagnetic sub-layer FM3 is antiferromagnetically coupled to the ferromagnetic sub-layer FM1 and ferromagnetically coupled to the ferromagnetic sub-layer FM4. The ferromagnetic sub-layer FM4 is antiferromagnetically coupled to the ferromagnetic sub-layers FM2.

Figure 18:
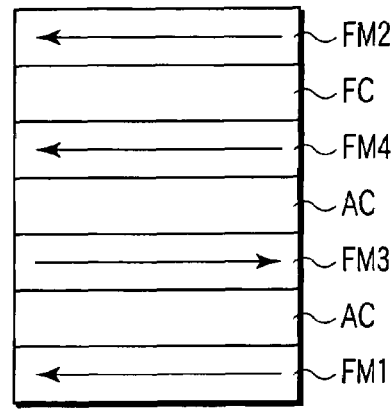
Figure 33:
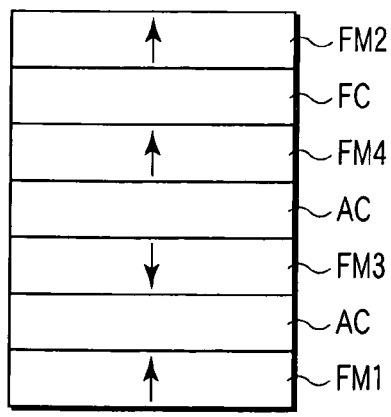

In the structure of FIGS. 18 and 33, nonmagnetic sub-layer AC, ferromagnetic sub-layer FM3, nonmagnetic sub-layer AC, ferromagnetic sub-layer FM4, and nonmagnetic sub-layer FC are stacked in order from the bottom between the ferromagnetic sub-layers FM1 and FM2. The ferromagnetic sub-layer FM3 is antiferromagnetically coupled to the ferromagnetic sub-layers FM1, FM4. The ferromagnetic sub-layer FM4 is ferromagnetically coupled to the ferromagnetic sub-layers FM2.

Figure 19:
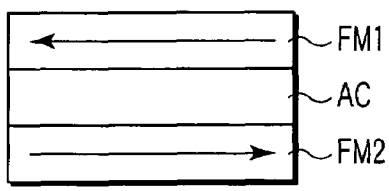
Figure 34:
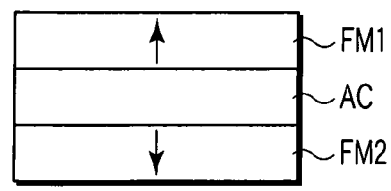

FIGS. 19 to 25 and 34 to 40 show that the top ferromagnetic sub-layer FM1 and the bottom ferromagnetic sub-layer FM2 are antiferromagnetically exchange-coupled. In the structure of FIGS. 19 and 34, the nonmagnetic sub-layer AC is provided between the ferromagnetic sub-layers FM1 and FM2. The ferromagnetic sub-layer FM1 is antiferromagnetically coupled to the ferromagnetic sub-layer FM2.

Figure 20:
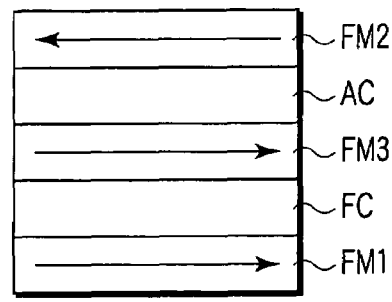
Figure 35:
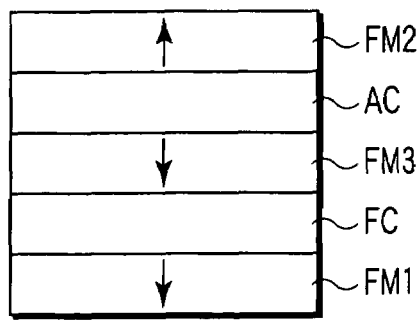

In the structure of FIGS. 20 and 35, nonmagnetic sub-layer FC, ferromagnetic sub-layer FM3 and nonmagnetic sub-layer AC are stacked in order from the bottom between the ferromagnetic sub-layers FM1 and FM2. The ferromagnetic sub-layer FM3 is ferromagnetically coupled to the ferromagnetic sub-layers FM1 and antiferromagnetically coupled to the ferromagnetic sub-layer FM2.

Figure 21:
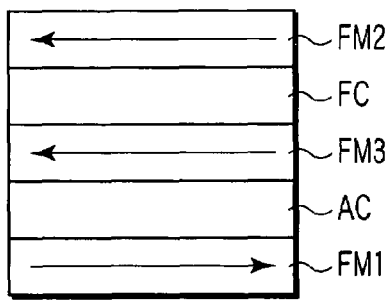
Figure 36:
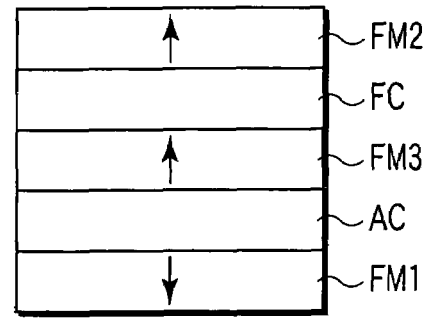

In the structure of FIGS. 21 and 36, nonmagnetic sub-layer AC, ferromagnetic sub-layer FM3 and nonmagnetic sub-layer FC are stacked in order from the bottom between the ferromagnetic sub-layers FM1 and FM2. The ferromagnetic sub-layer FM3 is antiferromagnetically coupled to the ferromagnetic sub-layers FM1 and ferromagnetically coupled to the ferromagnetic sub-layer FM2.

Figure 22:
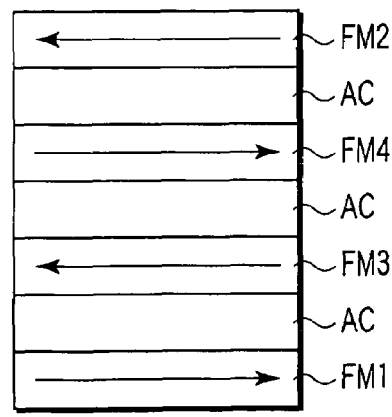
Figure 37:
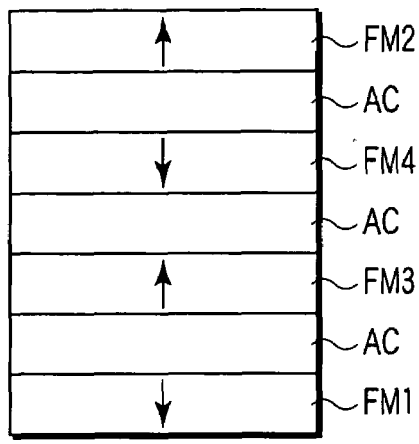

In the structure of FIGS. 22 and 37, nonmagnetic sub-layer AC, ferromagnetic sub-layer FM3, nonmagnetic sub-layer AC, ferromagnetic sub-layer FM4, and nonmagnetic sub-layer AC are stacked in order from the bottom between the ferromagnetic sub-layers FM1 and FM2. The ferromagnetic sub-layer FM3 is antiferromagnetically coupled to the ferromagnetic sub-layers FM1, FM4 and the ferromagnetic sub-layer FM4 is antiferromagnetically coupled to the ferromagnetic sub-layer FM2.

Figure 23:
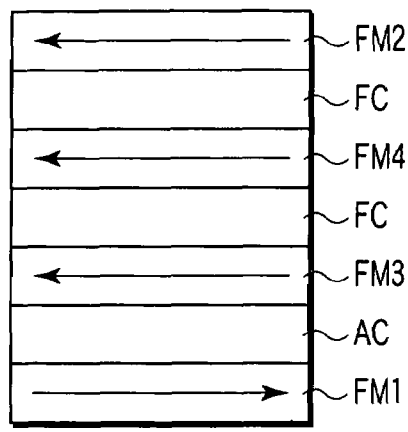
Figure 38:
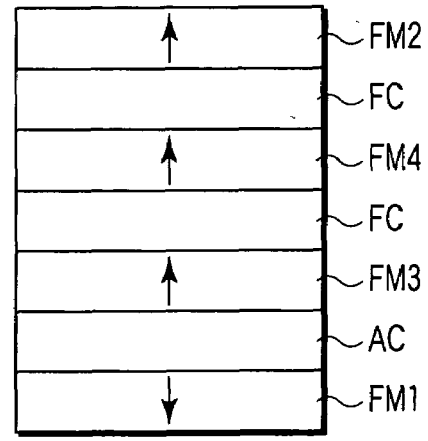

In the structure of FIGS. 23 and 38, nonmagnetic sub-layer AC, ferromagnetic sub-layer FM3, nonmagnetic sub-layer FC, ferromagnetic sub-layer FM4, and nonmagnetic sub-layer FC are stacked in order from the bottom between the ferromagnetic sub-layers FM1 and FM2. The ferromagnetic sub-layer FM3 is antiferromagnetically coupled to the ferromagnetic sub-layer FM1 and ferromagnetically coupled to the ferromagnetic sub-layer FM4. The ferromagnetic sub-layer FM4 is ferromagnetically coupled to the ferromagnetic sub-layer FM2.

Figure 24:
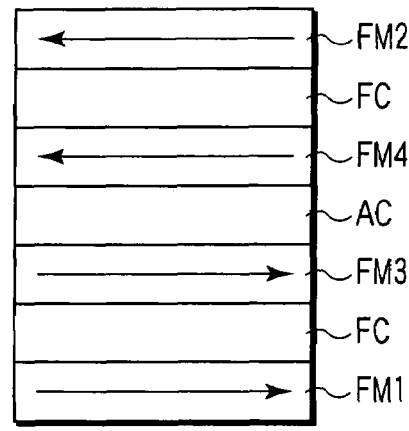
Figure 39:
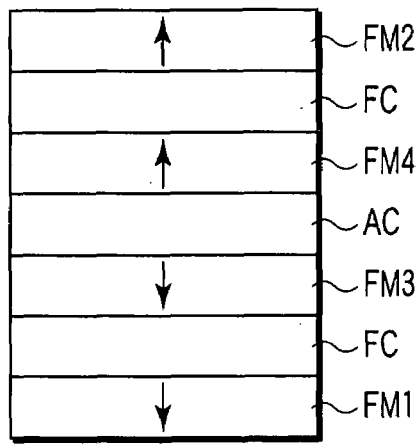

In the structure of FIGS. 24 and 39, nonmagnetic sub-layer FC, ferromagnetic sub-layer FM3, nonmagnetic sub-layer AC, ferromagnetic sub-layer FM4, and nonmagnetic sub-layer FC are stacked in order between the ferromagnetic sub-layers FM1 and FM2. The ferromagnetic sub-layer FM3 is ferromagnetically coupled to the ferromagnetic sub-layer FM1 and antiferromagnetically coupled to the ferromagnetic sub-layer FM4. The ferromagnetic sub-layer FM4 is ferromagnetically coupled to the ferromagnetic sub-layers FM2.

Figure 25:
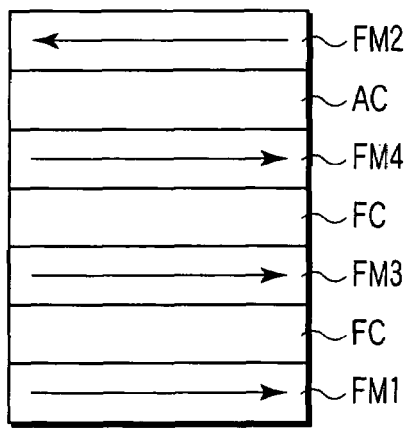

In the structure of FIGS. 25 and 40, nonmagnetic sub-layer FC, ferromagnetic sub-layer FM3, nonmagnetic sub-layer FC, ferromagnetic sub-layer FM4, and nonmagnetic sub-layer AC are stacked in order from the bottom between the ferromagnetic sub-layers FM1 and FM2. The ferromagnetic sub-layer FM3 is ferromagnetically coupled to the ferromagnetic sub-layers FM1, FM4 and the ferromagnetic sub-layer FM4 is antiferromagnetically coupled to the ferromagnetic sub-layers FM2.

When the structure shown in FIGS. 12 to 25 and 27 to 40 is employed, the magnetization direction of the ferromagnetic sub-layer FM adjacent to the antiferromagnetic layers AFR, AFW in FIGS. 2 to 5 is fixed by these antiferromagnetic layers. Then, with the magnetization direction of the ferromagnetic sub-layer FM adjacent to the antiferromagnetic layers AFR, AFW as a reference, the magnetization directions of remaining ferromagnetic sub-layers FM are fixed to a unique direction through the respective nonmagnetic sub-layers AC, FC as shown in FIGS. 12 to 25 and 27 to 40. The magnetization direction of the ferromagnetic sub-layers FM adjacent to the intermediate layers SR, SW in FIG. 1 represent a magnetization direction of the first fixed layer FPW, the free layer FF and the second fixed layer FPR upon writing or reading. Particularly, in case of FIGS. 4 and 5, the magnetization direction of the ferromagnetic sub-layers FM adjacent to the intermediate layer SR represent the magnetization direction of the free layer FF upon reading.

Figure 42:
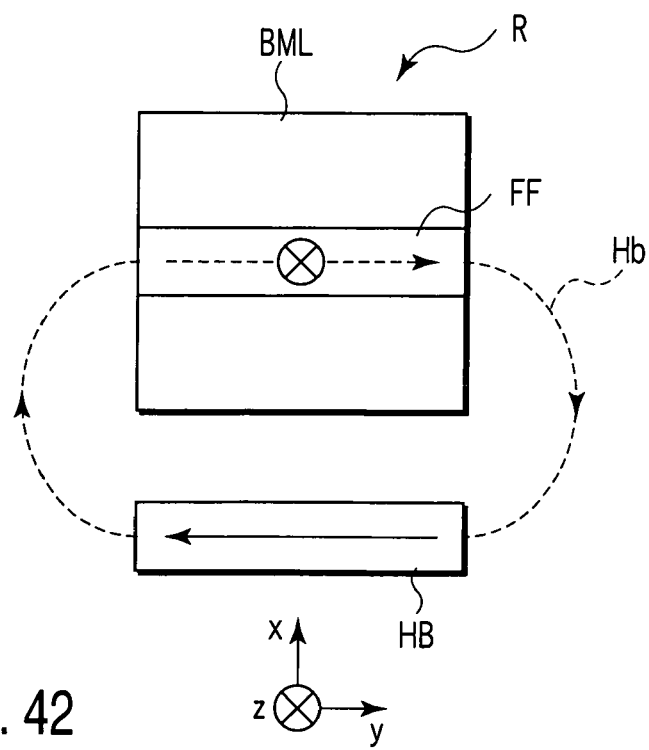
FIGS. 42, 43, 44, 45, 46 and 47 are schematic diagrams showing other example of disposition of hard bias layer.
Figure 43:
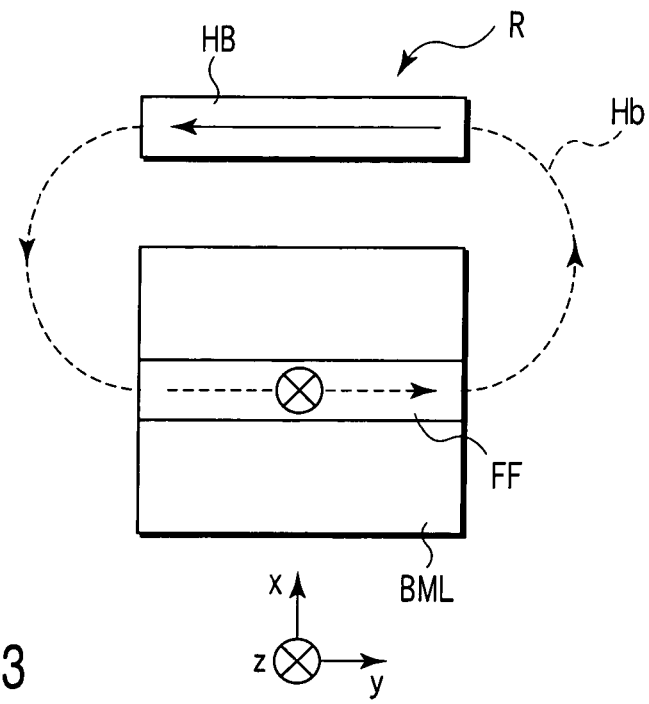
Figure 44:
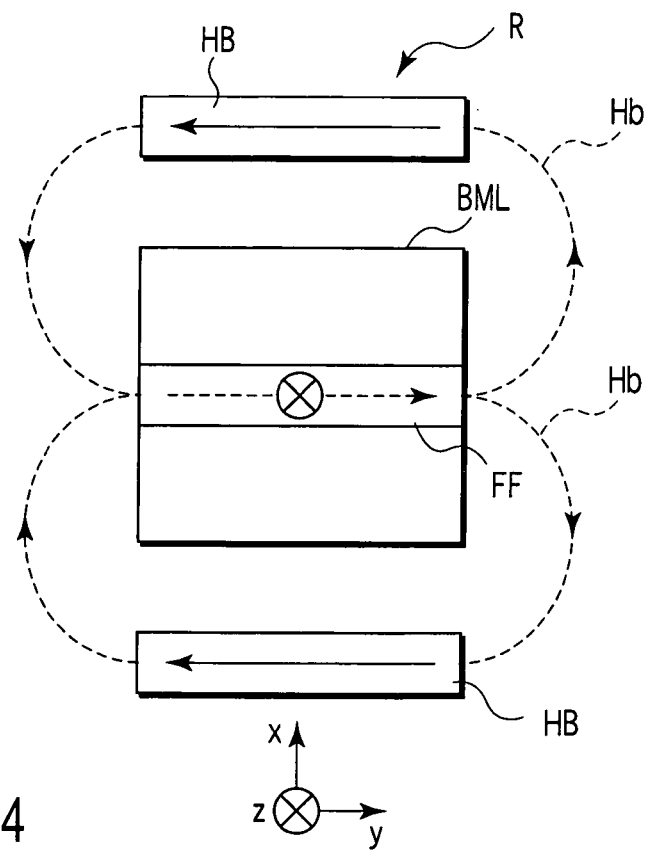
Figure 45:
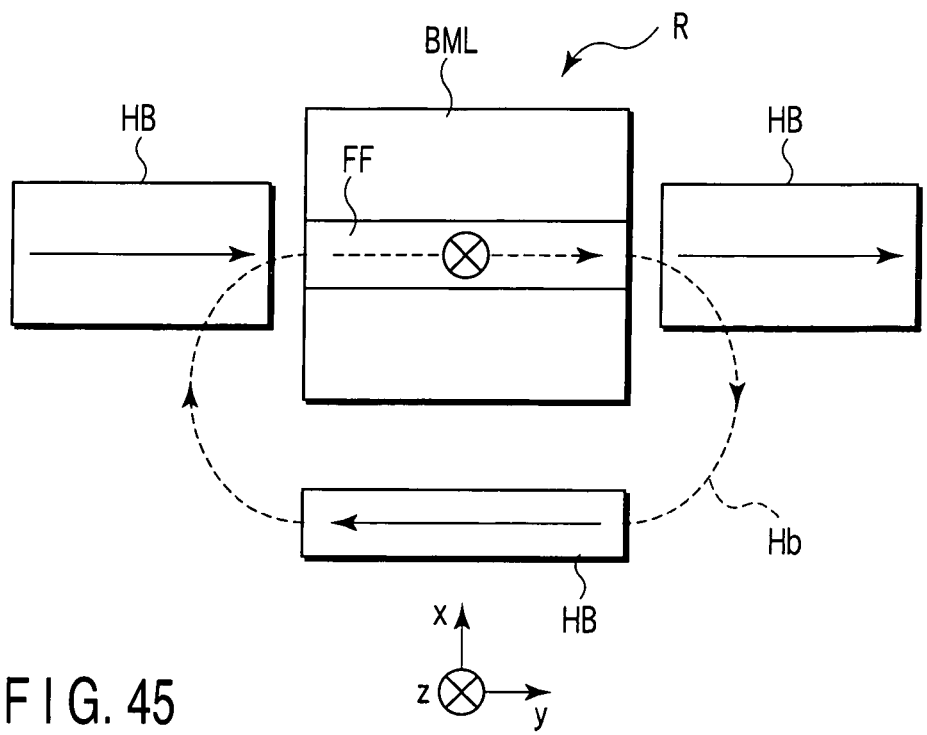
Figure 46:
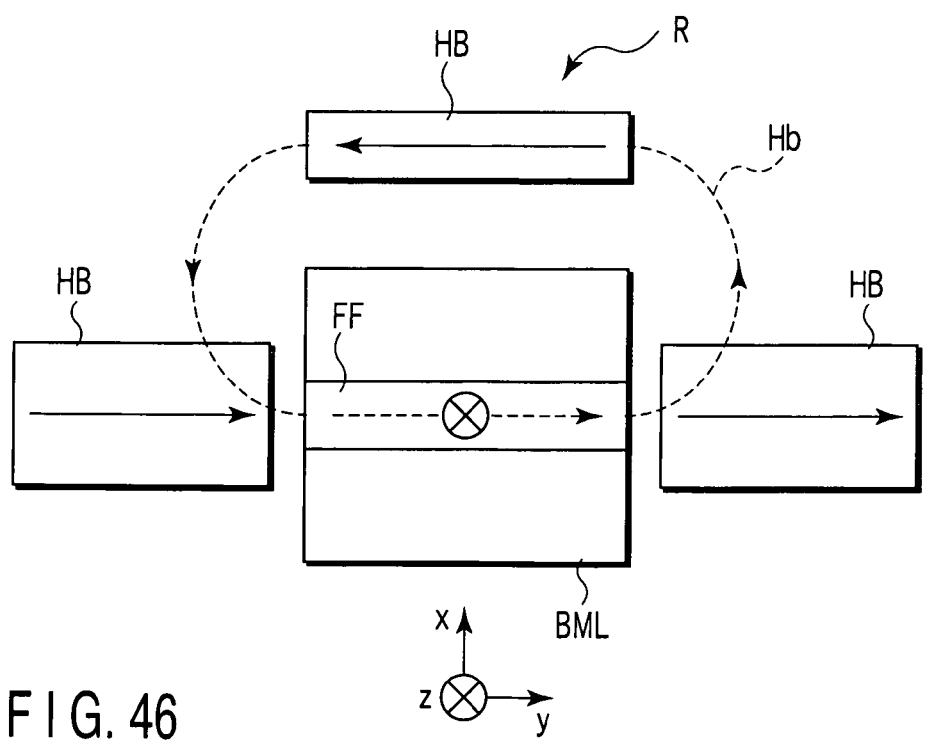
Figure 47:
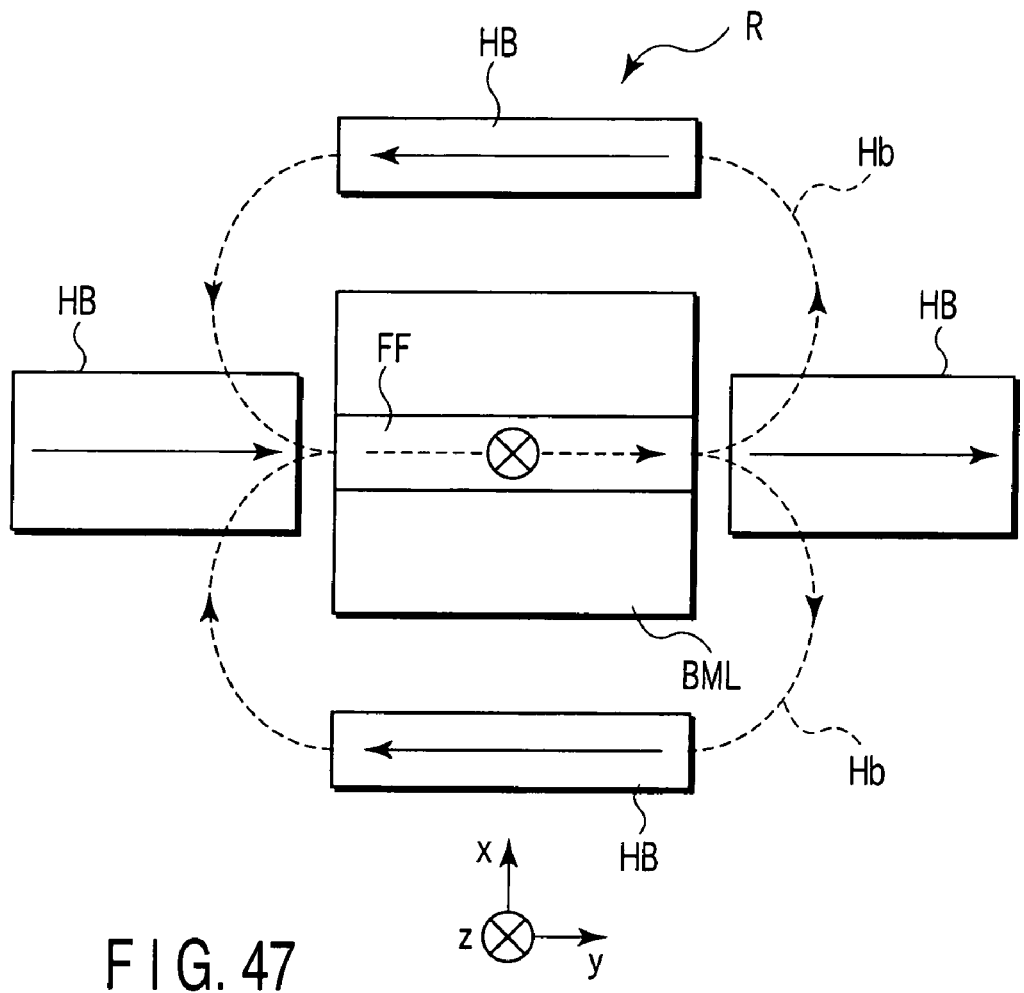

The hard bias layer HB does not necessarily exist in the y-axis direction from the basic lamination film BML as long as it can apply bias magnetic field $H_b$ in the y direction to the free layer FF. For example, as shown in FIGS. 42 to 44, the hard bias layer HB may exist in the x direction from the basic lamination film BML. In FIGS. 42, 43 and 44, the hard bias layer HB is provided on one side or both sides of above and below the basic lamination film BML apart from the basic film BML. Further, as shown in FIGS. 45 to 47, the hard bias layer HB may be disposed both in the x direction and y direction with respect to the basic lamination film BML. In FIGS. 45, 46 and 47, the hard bias layers HB are provided on both the right and left sides of the basic lamination film BML and on one side or both sides of above and below it, apart from the basic lamination films BML.

[1-4] Material and Film Thickness of Each Layer

Next, the structure and material of each layer of the aforementioned magnetic recording element will be described.

As the material of the antiferromagnetic layers AFW, AFR, it is preferable to use Fe—Mn, Pt—Mn, Pt—Cr—Mn, Ni—Mn, Pd—Mn, Pd—Pt—Mn, Ir—Mn, Pt—Ir—Mn, NiO, $Fe_2O_3$, magnetic semiconductor and the like.

As the magnetic material for use for the free layer FF, Co, Fe, Ni or alloy containing these may be used. The thickness of the free layer. FF is preferred to be in a range between 0.6 nm and 100 nm.

As the magnetic material for use in the first fixed layer FPW, it is possible to use FePt, CoPt, FePd, CoPd or the like whose anisotropy constant Ku is large and which indicates vertical magnetic anisotropy. Further, it is possible to use magnetic material which has a crystal structure of hcp structure (hexagonal close-packed structure) and indicates vertical magnetic anisotropy. Although magnetic material containing metal whose main component is Co is typically used, it is possible to use metal having other hcp structure. Additionally, it is possible to use material which is alloy of rare-earth elements and iron family transition elements and indicates vertical magnetic anisotropy. More specifically, GdFe, GdCo, GdFeCo, TbFe, TbCo, TbFeCo, GdTbFe, GdTbCo, DyFe, DyCo, DyFeCo and the like can be used. The higher the polarization of material of the fixed layer FPW, the higher the efficiency of spin transfer, which reduces the switching current more significantly. Therefore it is preferable to use material having a high spin polarization. Further, preferably, the thickness of the first fixed layer FPW is in a range between 0.2 nm and 50 nm. If the first fixed layer FPW has a lamination structure, Co may be used as a ferromagnetic sub-layer constituting it and Pt or Pd as nonmagnetic sub-layer.

As the second fixed layer FPR, Co, Fe, Ni or alloy containing these may be used. The higher the spin polarization of material of the second fixed layer FPR, the higher MR ratio when current is introduced vertically between the second fixed layer FPR and the free layer FF, which facilitates reading. Therefore, the spin polarization of material of the second fixed layer FPR is preferred to be high. A high spin polarization material called half metal is an ideal material. The half metal includes Heusler alloy, rutile type oxide, spinel type oxide, Perovskite type oxide, double perovskite type oxide, Sphalerite type chrome compound, pyrite type manganese compound, Sendust alloy. Preferably, the thickness of the second fixed layer FPR is in a range between 0.2 nm and 50 nm.

By adding nonmagnetic element such as Ag, Cu, Au, Al, Mg, Si, Bi, Ta, B, C, O, N, Pd, Pt, Zr, Ir, W, Mo, Nb, H to magnetic substance for use for the first fixed layer FPW, the second fixed layer FPR, and the free layer FF, its physical property such as magnetic characteristic, crystallinity, mechanical characteristic, chemical characteristic can be adjusted.

If the first fixed layer FPW, the second fixed layer FPR and/or the free layer FF have multilayer film structure, as material of nonmagnetic sub-layer constituting it, Cu, Au, Ag, Ru, Ir, Os or an alloy containing one or more of these may be used.

If nonmagnetic metal is used for the intermediate layers SW, SR, it is possible to use any one of Au, Cu, Cr, Zn, Ga, Nb, Mo, Ru, Pd, Ag, Hf, Ta, W, Pt, Bi or an alloy containing one or more of these. Preferably, the thickness of the intermediate layers SW, SR constituted of this nonmagnetic metal is in a range between 0.2 nm and 20 nm.

To intensify the magnetoresistance effect of the basic lamination film BML of FIGS. 4 and 5, it is effective to make material of the intermediate layer SR function as a tunnel barrier layer. As material of the intermediate layer SR, it is possible to use $Al_2O_3$, $SiO_2$, MgO, AlN, $Bi_2O_3$, $MgF_2$, $CaF_2SrTiO_2$, $AlLaO_3$, Al—N—O, Si—N—O, a nonmagnetic semiconductor (ZnO, InMn, GaN, GaAs, $TiO_2$, Zn, Te, or the materials doped with a transition metal), or the like. These compounds do not need to have a completely accurate composition in stoichiometrical terms and may contain deficit of oxygen, nitrogen, fluorine or excessive shortage thereof. Preferably, the thickness of the intermediate layer SR constituted of this insulation material is in a range of 0.2 nm or more to 50 nm or less.

As material of the hard bias layer HB, a variety of magnetic materials such as CoPt and $CoFe_2O_4$ having a high insulation property may be used.

[1-5] Example

Figure 48:
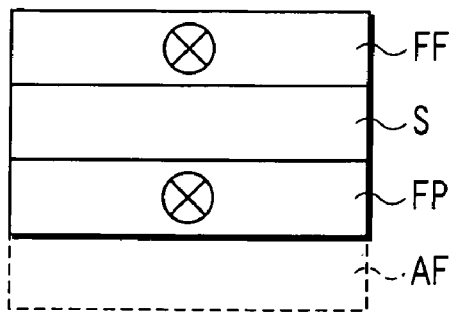
FIGS. 48 and 49 are schematic diagrams showing the sectional structure of a magnetic recording element as a comparative example.
Figure 49:
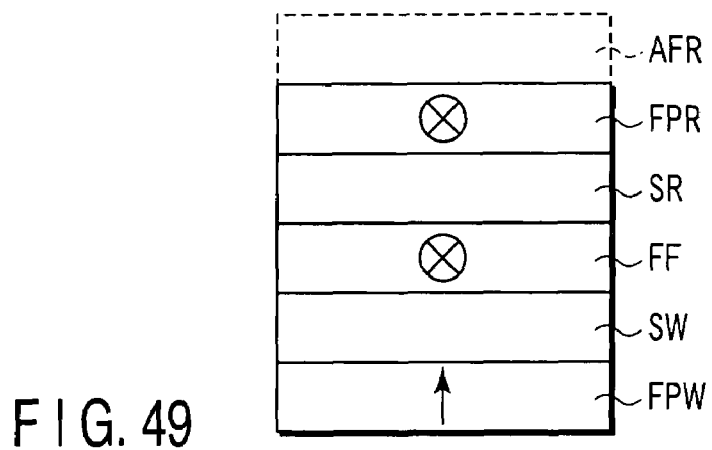

As an example of this embodiment, a sample 1 of the magnetic recording element was produced and samples 2 and 3 were produced as comparative examples. The sample 1 has a structure in which the basic lamination film BML is applied to the structure of FIG. 1 and includes following materials. The sample 2 has a structure shown in FIG. 48 and includes following materials and writing is performed according to the conventional method 1. The sample 3 has a structure shown in FIG. 49 and includes following materials and writing is performed according to the conventional method 2. Although not shown in FIGS. 1, 48 and 49, an example in which an electrode (wiring) EL1 and electrode (wiring) EL2 are provided above and below each of the basic lamination film BML of the sample 1, the sample 2 and the sample 3 is shown below. A value provided with a unit nm in the parentheses means film thickness.

Sample 1: electrode EL1 (Cu)/antiferromagnetic layer AFR (PtMn: 20 nm)/second fixed layer FPR (Co: 10 nm)/intermediate layer SR ($Al_2O_3$: 0.6 nm)/free layer FF (lamination film of CoFeNi: 2 nm/Co: 1 nm)/intermediate layer SW (Cu: 6 nm)/first fixed layer FPW (FePt: 10 nm)/electrode EL2 (Cu), hard bias layer: $CoFe_2O_4$ Sample 2: electrode EL1 (Cu)/free layer FF (lamination film of CoFeNi: 2 nm/Co: 1 nm)/intermediate layer S ($Al_2O_3$: 0.6 nm)/fixed layer FP (Co: 10 nm)/antiferromagnetic layer AF (PtMn: 20 nm)/electrode EL2 (Cu)

Sample 3: electrode EL1 (Cu)/antiferromagnetic layer AFR (PtMn: 20 nm)/second fixed layer FPR (Co: 10 nm)/intermediate layer SR ($Al_2O_3$: 0.6 nm)/free layer FF (lamination film of CoFeNi: 2 nm/Co: 1 nm)/intermediate layer SW (Cu: 6 nm)/spin supply layer FPW (FePt: 10 nm)/electrode EL2 (Cu)

The magnetic recording element of the sample 1 was produced in a following process. That is, first, lower electrode EL2 was formed on top of a wafer. Next, first fixed layer FPW was formed using a ultra-high vacuum sputter unit. Vertical magnetic anisotropy was given to the first fixed layer FPW by annealing this wafer in magnetic field in magnetic field vacuum furnace at 500° C. for 10 hours. After that, a lamination structure composed of the intermediate layer SW, the free layer FF, the intermediate layer SR, the second fixed layer FPR and the antiferromagnetic layer AFR was formed on the first fixed layer FPW by using the ultra high vacuum sputter unit. A protective film was formed on the lamination structure. Uniaxial anisotropy was given to the ferromagnetic layer FF and the second fixed layer FPR by annealing this wafer in magnetic field in a magnetic field vacuum furnace at 270° C. for 10 hours.

Next, electron beam (EB) resist was formed on the protective film and the resist was exposed to light to be processed into a mask which has a shape corresponding to a shape of a magnetic recording element. Next, an area not covered by the mask was etched with an ion milling unit. The processing size of the cell was 100 nm×50 nm. After etching, the mask was removed and $SiO_2$, $CoFe_2O_4$, $SiO_2$ were formed between cells using the ultra high vacuum sputter unit. After that, the surface was smoothed by ion milling and the upper surface of the protective film was revealed. Upper electrode EL1 was formed on the surface of the protective film. As a result, a magnetic recording element as shown in FIGS. 5 and 1 was formed. The samples 2 and 3 were produced in the same process. Note that vertical magnetic anisotropy was given to the spin supply layer FPW of the sample 3.

A lower limit value (switching current value) of current necessary for switching the magnetization of the free layer FF was obtained from changes in resistance to the quantity of current introduced in the vertical direction to a joint surface of each layer. As a result, the average of the switching current value was 0.9 mA for the sample 1 and 2.5 mA for the sample 2. Pulsed and intensity-constant current is supplied to the samples while the pulse width is changed. As a result, the magnetization direction was switched in the sample 1 when current of 1.0 mA was introduced for 0.5 ns. The sample 2 took about 5 ns on average to switch its magnetization when current of 3 mA was introduced. That is, when a device having the structure of this embodiment was used instead of the conventional method 1, the switching current was reduced and at the same time, accelerated.

As for the sample 3, the magnetization switching was observed when current of 1.1 mA was introduced in some of the test pieces. However, the switching was realized only probablisticly. In the samples 1 and 2, the piece-to piece variations were less significant. The results conclude that that controllability of magnetization switching was improved by using the device having the structure of this embodiment instead of the conventional method 2.

[1-6] Effect

According to the magnetic recording element of the first embodiment of the present invention, bias magnetic field is applied in the along magnetization hard axis of the free layer FF in the basic lamination film BML. Thus, it is possible to provide a magnetic recording element capable of achieving smaller switching current, higher speed switching time and higher controllability of magnetization switching than the conventional two kinds of the magnetic recording elements.

(2) SECOND EMBODIMENT

According to the second embodiment, the hard bias layer HB outside of the basic lamination film BML according to the first embodiment is added to the basic lamination film BML.

[2-1] Structure

Figure 50:
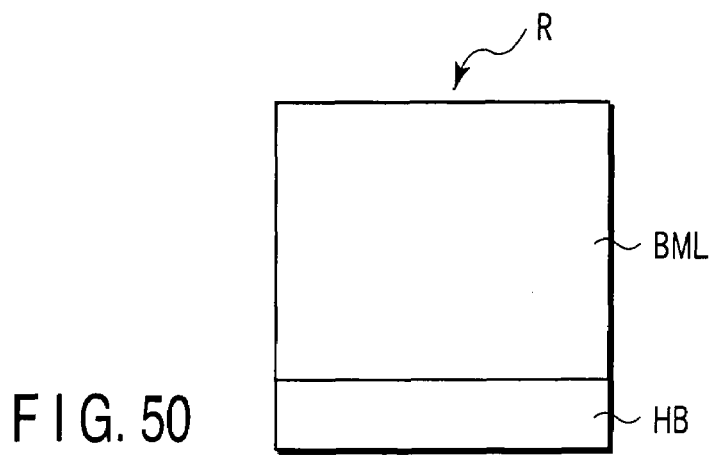
FIGS. 50 and 51 are schematic diagrams showing the sectional structure of a magnetic recording element according to a second embodiment.
Figure 51:
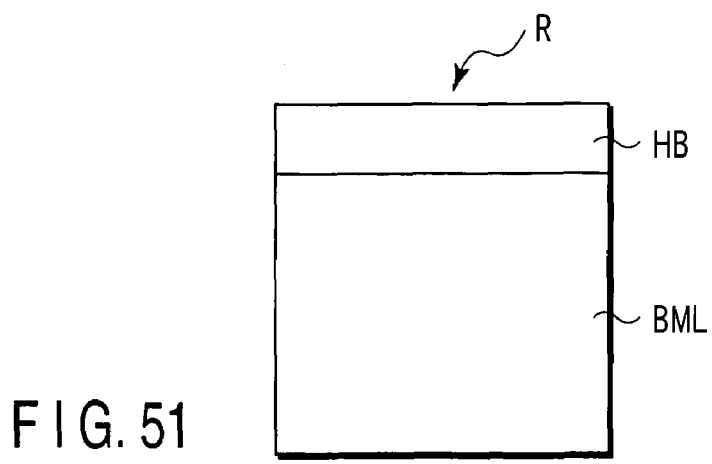

FIGS. 50 and 51 schematically show the sectional structure of the magnetic recording element according to the second embodiment of the present invention. As shown in FIG. 50, the hard bias layer is provided at the bottom of the basic lamination film BML to contact with its bottom layer. In a structure shown in FIG. 51, the hard bias layer HB is provided at the top of the basic lamination film BML to contact with its top layer. The magnetization direction of the hard bias layer is the same as that of the hard bias layer HB having a structure shown in FIG. 42 or 43 of the first embodiment. This device is produced in the same manufacturing process as the magnetic recording element R of the first embodiment. As the structure and material of the basic lamination film BML, every styles indicated in the first embodiment may be employed. Writing and reading method are the same as the first embodiment.

[2-2] Example

As an example of this embodiment, by applying the basic lamination film BML of FIG. 4 to the structure shown in FIG. 50, the samples 1 and 2 of the magnetic recording elements having following materials were produced. This sample 1 was produced in the same process as the sample 1 of an example of the first embodiment. Although not shown in FIG. 50, an example in which an electrode (wiring) EL1 and electrode (wiring) EL2 are provided above and below each of the basic lamination film BML of the sample 1, the sample 2 is shown below. A value provided with a unit nm in the parentheses means film thickness.

Sample 1: electrode EL1 (Cu)/fixed layer FPW (TbCo: 10 nm)/intermediate layer SW (Cu: 6 nm)/free layer FF (FeNi: 2 nm)/intermediate layer SR (MgO: 0.8 nm)/second fixed layer FPR (Co: 6 nm)/antiferromagnetic layer AFR (IrMn: 20 nm)/hard bias layer HB (CoPt: 10 nm)/electrode EL2 (Cu)

Sample 2: electrode EL1 (Cu)/first fixed layer FPW (TbCo: 10 nm)/intermediate layer SW (Cu: 6 nm)/free layer FF (FeNi: 2 nm)/intermediate layer SR (MgO: 0.8 nm)/second fixed layer FPR ($Fe_3O_4$: 10 nm)/antiferromagnetic layer AFR (PtIrMn: 15 nm)/hard bias layer HB (CoPt: 10 nm)/electrode EL2 (Cu)

The characteristic of magnetization switching by a magnetic recording element of Sample 1 and sample 2 was the same as the first embodiment. Although material having a higher spin polarization than the sample 1 was used for the second fixed layer FPR in the sample 2, little change was observed in the switching current as compared with the sample 1. This is because an angle between the magnetization direction of the free layer FF and the magnetization direction of the second fixed layer FPR is small, therefore spin-polarized current in the magnetization direction of the second fixed layer FPR causes spin transfer torque less significantly than the spin-polarized current in the magnetization direction of the first fixed layer FPW does. This result shows that the characteristic of the first fixed layer FPW gives more influence on the value of the switching current than the characteristic of the second fixed layer FPR.

On the other hand, the magnetoresistance ratio was 20% in the sample 1 and 70% in the sample 2, whereby indicating a large difference. This is because the magnetoresistance ratio of tunnel current flowing in the intermediate layer SR is increased by using a high spin-polarized material for the second fixed layer FPR. That is, the characteristic of the second fixed layer FPR gives a great influence on the value of the magnetoresistance ratio. Thus, it is more preferable to use the high spin-polarized material for the second fixed layer FPR.

[2-3] Effect

According to the magnetic recording element of the second embodiment of the present invention, the bias magnetic field is applied in the magnetization hard axis of the free layer FF in the basic lamination film BML like the first embodiment. Thus, the same effect as the first embodiment is obtained.

According to the magnetic recording element of the second embodiment, the hard bias layer HB is provided within the basic lamination film BML. As a result, there is a large merit for manufacturing, for example, the area of a memory cell can be reduced and the hard bias layer HB can be processed at the same time as the basic lamination film BML.

(3) THIRD EMBODIMENT

According to this embodiment, wiring is provided near the basic lamination film BML or a magnetic recording element including the basic lamination film BML and a current flowing through the wiring generates magnetic field for bias magnetic field.

[3-1] Structure

FIG. 52 is a perspective view showing schematically a memory cell according to the third embodiment of the present invention. As shown in FIG. 52, the memory cell comprises a magnetic recording element R containing the basic lamination film BML and wiring BL and wiring WL. The magnetic recording element R may be constituted of only the basic lamination film BML or have a structure in which the hard bias layer HB is added to the basic lamination film BML as shown in the second embodiment. Further, it may have a structure in which conductive films (not shown) are added above and below. The hard bias layer HB may be provided around the magnetic recording element R as indicated in the first embodiment.

The wiring BL is connected to the top face of, for example, the magnetic recording element R (or basic lamination film BML). The wiring WL is connected to the bottom face of, for example, the magnetic recording element R (or basic lamination film BML).

[3-2] Writing

Writing of data into the magnetic recording element R is carried out by applying a voltage between an end of the wiring BL and an end of the wiring WL or flowing a current between them. A current (wiring current) $I_R$ is introduced into the magnetic recording element R, which causes both an operation by spin-polarized current (spin transfer torque) flowing across the free layer FF and an operation of current magnetic field to be applied to the free layer FF upon writing. The magnetization direction of the free layer FF can be changed to a desired direction by the two operations.

The magnetic field acting on the free layer FF is a synthetic magnetic field of magnetic field (current magnetic field) generated by current flowing through the wiring BL and the wiring WL and leaking magnetic field (bias magnetic field) generated by the hard bias layer HB and other magnetic layer in the basic lamination film BML. When the magnitude of current magnetic field is less than 10% the magnitude of the bias magnetic field, in other words when the bias magnetic field is predominant, the writing method is the same as the first embodiment.

An optimum wiring current flowing method for carrying out this embodiment will be described when the magnitude of current magnetic field is 10% or more the bias magnetic field so that the current magnetic field cannot be neglected, with reference to FIGS. 52 and 53. FIG. 53 is a top view of the memory cell according to the third embodiment. $\theta_B$ represents an angle between the wiring BL and the magnetization easy axis (z direction) of the free layer FF and LB represents a distance from the wiring BL to the center of the free layer FF. The magnetic field created at the position of the free layer FF by the current $I_B$ flowing through the wiring BL has a direction of an angle $\theta_B-90°$ to the magnetization easy axis and its magnitude is inversely proportional to the distance $L_B$.

Similarly, $\theta_W$ represents an angle between the wiring WL and the magnetization easy axis of the free layer FF and $L_W$ represents a distance from the wiring WL to the center of the free layer FF. The magnetic field created at the position of the free layer FF by the current $I_W$ flowing through the wiring WL is directed with an angle $\theta_W+90°$ from the magnetization easy axis and its magnitude is inversely proportional to the distance $L_W$.

The free layer FF receives synthetic magnetic field of magnetic field generated by the wiring BL and magnetic field generated by the wiring WL. In order for this synthetic magnetic field to be oriented in the magnetization hard axis (+y direction) of the free layer, it is sufficient that any one of relations shown below is satisfied.

$$L_B<<L_W, \text{ and } \theta_B=180° \quad (1\text{-}1)$$

$$L_B<<L_W, \text{ and } \theta_W=0° \quad (1\text{-}2)$$

$$L_B=L_W, \text{ and } (\theta_B, \theta_W)=(135°, 45°) \text{ or } (-135°, -45°) \quad (1\text{-}3)$$

In order for the synthetic magnetic field to be oriented in the magnetization hard axis (−y direction) of the free layer FF, it is sufficient that any one of relations shown below is satisfied.

$$L_B<<L_W, \text{ and } \theta_B=0° \quad (2\text{-}1)$$

$$L_B<<L_W, \text{ and } \theta_W=180° \quad (2\text{-}2)$$

$$L_B=L_W, \text{ and } (\theta_B, \theta_W)=(45°, 135°) \text{ or } (-45°, -135°) \quad (2\text{-}3)$$

The case of (1-3), (2-3) needs only $1/\sqrt{2}=0.7$ times as much current as the case of (1-1), (1-2), (2-1), (2-2) to generate current necessary for generating magnetic field of the same magnitude.

As described in the section of writing of the first embodiment, there are an upper limit and lower limit in the magnitudes of magnetic field and current to implement embodiments of the present invention. Thus, the magnitude of the bias magnetic field needs to be adjusted appropriately to set the magnitude of synthetic magnetic field of the bias magnetic field and current magnetic field and the strength of current within the above-mentioned range in order to carry out this embodiment. The projection component of the synthetic field in the direction parallel to the hard axis of the free layer needs to fall within the range of the bias magnetic field $H_b$ described in the first embodiment. To carry out this embodiment without using the hard bias layer HB, the magnitudes of current and current magnetic need to be independently changed to fall within the aforementioned range. This can be achieved by using different materials having different values of the spin polarization for the first fixed layer FPW. Introducing currents of the same magnitude to materials having a different spin polarization enables adjustment of the current strength because the magnitude of generated spin transfer torque is different.

When the direction of the current flowing in the magnetic recording element R is reversed, the direction of the spin-transfer torque acting on the free layer FF is reversed. When the direction of the current flowing in the wiring BL and the wiring WL is reversed, the direction of the current magnetic field acting on the free layer FF is reversed. According to the embodiments of the present invention, as described in section [1-2], reversing one of the spin-transfer torque and the magnetic field which act on the free layer FF can direct the magnetization direction of the free layer FF in one of two directions differing each other. Therefore, changing the direction of the current flowing in the magnetic recording element R with the direction of the current flowing in the wiring BL and the wiring WL fixed can control the magnetization direction of the free layer FF. As another method, changing the direction of the current flowing in the wiring BL and the wiring WL with the direction of the current flowing in the magnetic recording element R fixed can control the magnetization direction of the free layer FF.

[3-3] Example

As an example of this embodiment, samples 1 and 2 of memory cells having a magnetic recording element having the structure shown in FIG. 1 of the first embodiment and composed of following materials were produced in the same process as the example of the first embodiment (section [1-5]). The samples 1 and 2 have completely the same structure, material and thickness except that electrodes EL1, EL2 differ in film thickness. A value provided with a unit nm in the parentheses means film thickness in a description below.

Structures of samples 1 and 2: wiring BL/electrode EL1 (Cu)/antiferromagnetic layer AFR (PtMn: 20 nm)/second fixed layer FPR (Co: 10 nm)/intermediate layer SR ($Al_2O_3$: 0.6 nm)/free layer FF (Co: 2 nm)/intermediate layer SW (Cu: 6 nm)/first fixed layer FPW (FePt: 15 nm)/electrode EL2 (Cu)/wiring WL, bias layer HB: $CoFe_2O_4$ Magnetic field was applied to these samples from outside to measure their magnetoresistance so as to measure coersive force of the free layer FF. The result showed that a magnetic field of 20 Oe was applied to both the samples 1 and 2 as the bias magnetic field even when no current is introduced. When a current of 1.0 mA was introduced to the sample 1, the magnetization direction of the free layer FF was switched in most cases. On the other hand, when current of more than 1.5 mA was introduced, the magnetization was switched only occasionally. Although the magnetization direction was sometimes switched when current of more than 1.3 mA was introduced to the sample 2, namely the switching depends on occasions.

Generally, a current flowing in a half-line generates a magnetic field of the magnitude $H_{ext}$ at a place apart from it.

$$H_{ext}[Oe]=28 \times I[mA] \times (r[nm]/35)^{-1}$$

In the sample 1, a distance $L_B$ from the wiring BL to the center of the free layer FF and a distance $L_W$ from the wiring WL to the center of the free layer FF are almost equal and 35 nm. In the sample 2, the distance $L_B$ and the distance $L_W$ are almost equal and 100 nm. The thickness of the electrode layers EL1, EL2 is determined so that they satisfy these conditions.

The wiring BL and the wiring WL are disposed to have an angle of 45° with respect to the magnetization easy axis of the free layer FF ($\theta_B=135°$, $\theta_W=45°$) Current magnetic field $H_{ext}$, which is generated in the center of the free layer FF by the wirings BL, WL when current is introduced to these samples 1 and 2, can be calculated. When current of 1 mA is introduced, 40 Oe is generated in the sample 1 and 10 Oe is generated in the sample 2. Therefore, when current of 1 mA is introduced, total bias magnetic field of 60 Oe is applied to the free layer FF in the sample 1 and in the sample 2, total bias magnetic field of 30 Oe is applied.

The value of the bias magnetic field h respectively corresponds to 0.4, 0.26 when it is standardized with anisotropy field $H_k=150$ Oe of the free layer FF composed of Co (k: about 0.02). The reason of this result can be explained when comparing this value with FIG. 8. That is, when the strength of current was increased in the sample 1, a change of S→R→P was observed. To the contrary, it seems that a change of S-P was seen when the strength of current was increased from 0 because large distance from the wiring BL and WL to the free layer FF caused an insufficient bias magnetic field.

[3-4] Effect

According to the memory cell of the third embodiment, current magnetic fields of current flowing through the wirings BL, WL connected to the basic lamination film BML of the first embodiment and the magnetic recording element R of the second embodiment are applied in the magnetization hard axis of the free layer FF as bias magnetic field. Therefore, it is possible to provide a magnetic recording element capable of achieving smaller switching current, higher speed switching time and higher magnetization switching controllability than the conventional two kinds of the magnetic recording elements by the same mechanism as the first embodiment.

(4) FOURTH EMBODIMENT

[4-1] Structure

The fourth embodiment concerns modification of the third embodiment. According to the fourth embodiment, as well as the wiring BL and the wiring WL, a third wiring TL is introduced and synthetic magnetic field of current magnetic fields from the wiring BL, wiring WL and wiring TL is applied to the free layer FF upon writing.

Figure 54:
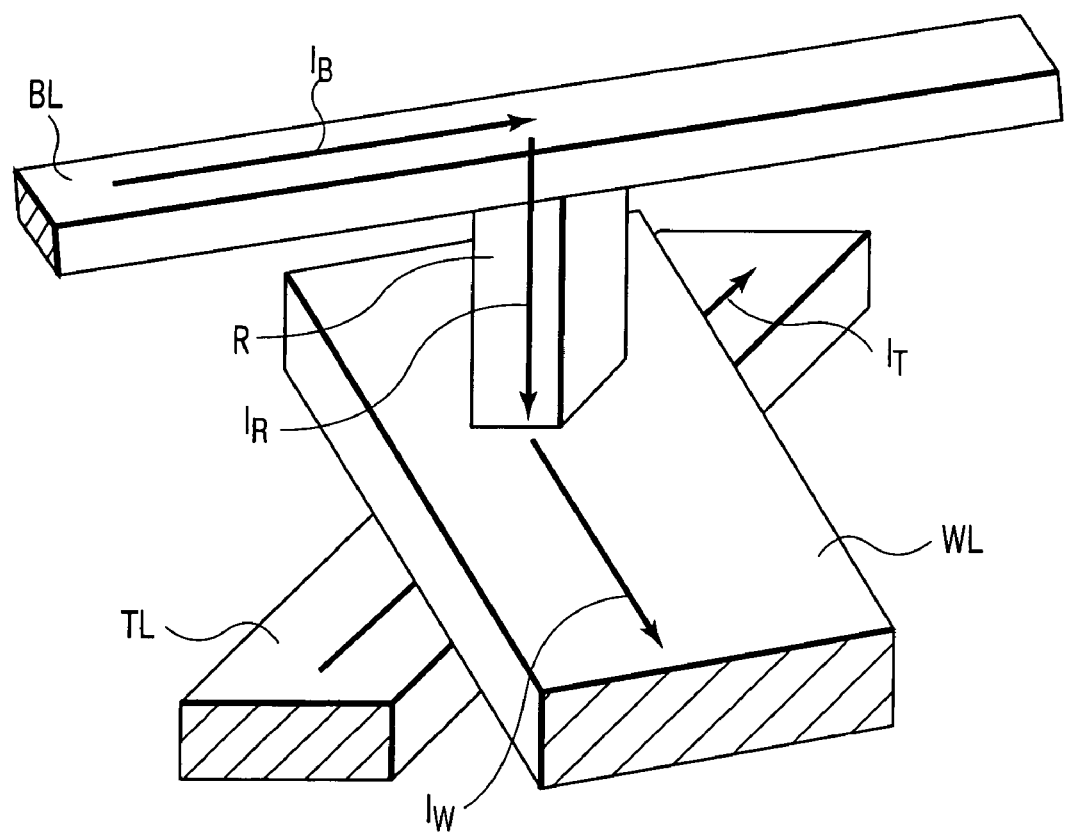
FIGS. 54 and 55 are perspective views showing schematically one of the memory cells according to the fourth embodiment.
Figure 55:
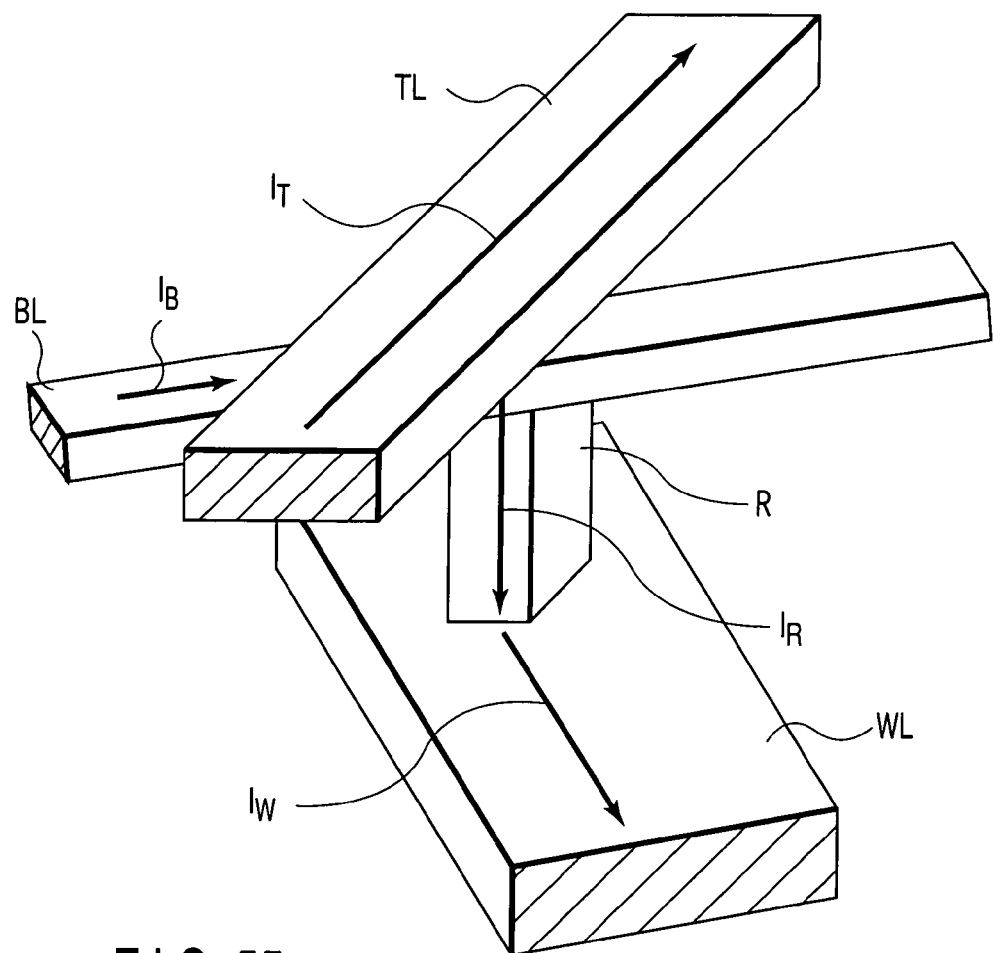
Figure 56:
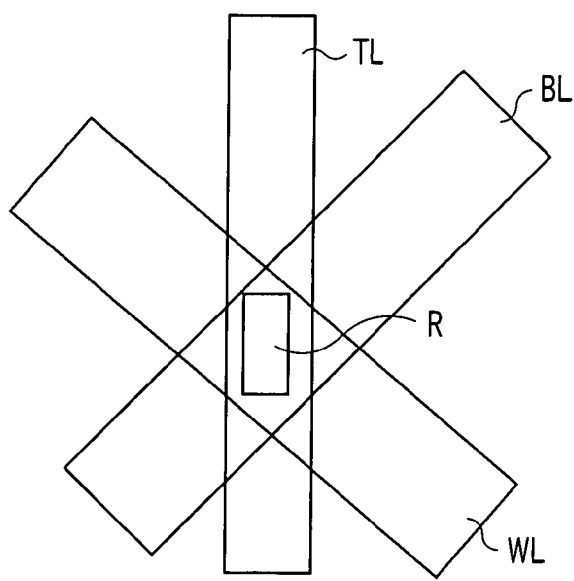
FIG. 56 is a top view of the memory cell according to the fourth embodiment.

FIGS. 54 and 55 are perspective views showing schematically a memory cell of the fourth embodiment. FIG. 56 is a top view of the memory cell of the fourth embodiment. In addition to the structure of FIG. 52, the wiring TL is provided below the wiring WL (in case of FIG. 54) or above the wiring BL (in case of FIG. 55). When data is written into a memory cell having this structure, voltage is applied between both ends of the wiring TL or current is supplied between them. As a result, current magnetic field by current $I_T$ flowing through the wiring TL is applied to the free layer FF.

The magnitude of current magnetic field generated in the free layer FF by each of the wirings BL, WL, TL is inversely proportional to a distance from the wirings BL, WL, TL to the center of the free layer FF respectively and proportional to the strength of current flowing through the wirings BL, WL, TL respectively. A direction of current magnetic field of each of the wirings BL, WL, TL is perpendicular to the direction in which each of the wirings BL, WL, TL extends within the film face of the free layer FF. The distance from each of the wirings BL, WL, TL to the center of the free layer FF, angles of the wirings BL, WL, TL, direction of current flow and strength of current are adjusted, thereby the synthetic magnetic field of three current magnetic fields can be set along the magnetization hard axis. For example, the wirings BL, WL are directed to directions of 45° and 135° with respect to the magnetization easy axis of the free layer FF as described in the third embodiment. Further, the wiring TL is directed parallel to the magnetization easy axis of the free layer FF as shown in FIG. 56, thereby magnetic field oriented to the magnetization hard axis of the free layer FF can be applied when current is introduced to the wiring TL.

Although an example in which a single wiring TL is provided is described, some wirings may be provided. In this case, it is preferable that synthetic magnetic field of magnetic fields generated when currents are introduced to all the wiring BL, wiring WL and wiring TL at the same time is along the magnetization hard axis. Regardless of the wiring TL, a component of the synthetic magnetic field of current magnetic field and bias magnetic field along the magnetization hard axis of the free layer FF needs to fall within a range of the bias magnetic field $H_b$ described in the first embodiment, like the third embodiment.

[4-2] Effect

According to the memory cell of the fourth embodiment of the present invention, current magnetic field of current flowing through the wirings BL, WL connected to the basic lamination film BML or the magnetic recording element R is applied in the magnetization hard axis of the free layer FF as bias magnetic field $H_b$ like the third embodiment. Thus, the same effect as the first embodiment is obtained.

Further according to the fourth embodiment, the wiring TL is provided and the current magnetic field by the wiring TL is applied in the magnetization hard axis of the free layer FF. Thus, the magnitude of the bias magnetic field $H_b$ applied to the free layer FF can be set using current values of the wirings BL, WL, TL and therefore it can be adjusted more finely.

(5) FIFTH EMBODIMENT

The fifth embodiment concerns a modification of the third embodiment. According to the fifth embodiment, a conductor layer C is provided near the magnetic recording element R and magnetic field generated by current flowing through the conductor layer C is used upon writing.

[5-1] Structure

FIGS. 57, 59, 61 and 63 are perspective views showing schematically one of the memory cells of the fifth embodiment of the present invention. FIGS. 58, 60, 62 and 64 are top views of FIGS. 57, 59, 61 and 63. A difference among FIGS. 57, 59, 61 and 63 is that the combinations of wirings connected to the conductor layer C differ between one and another.

As shown in FIGS. 57 and 58, the conductor layer C is provided apart from the magnetic recording element R near the magnetic recording element R. The magnetic recording element R and the conductor C are insulated electrically. An end of the conductor layer C is connected to the wiring BL while the other end is connected to the wiring WL.

Writing of data into the memory cell having the structure shown in FIGS. 57 and 58 is carried out by applying a voltage between an end of the wiring BL and an end of the wiring WL or supplying current to between them. As a consequence, current $I_C$ flows through the conductor layer C so that current magnetic field by the current $I_C$ is applied to the free layer FF.

AS same in the fourth embodiment, the wirings BL, WL and the conductor layer C generate a current magnetic field, which acts on the free layer FF. Thus, by adjusting the directions of the wirings WL, BL and strength of supplied current appropriately, synthetic magnetic field along the hard axis can be applied to the free layer FF. For example, the wirings BL, WL are disposed at 45° and 135° with respect to the easy axis of the free layer FF respectively. The conductor layer C is disposed on an extension of the easy axis of the free layer FF and near it. As a result, magnetic field can be applied along the hard axis to the free layer FF from the conductor layer C.

Synthetic magnetic field composed of current magnetic field from the conductor layer C and bias magnetic field is set to fall with in the condition mentioned in the third embodiment. Material, size and the like of the conductor layer C are selected so as to satisfy this condition, thereby the magnitude of current magnetic field from the conductor layer C is adjusted.

Figure 59:
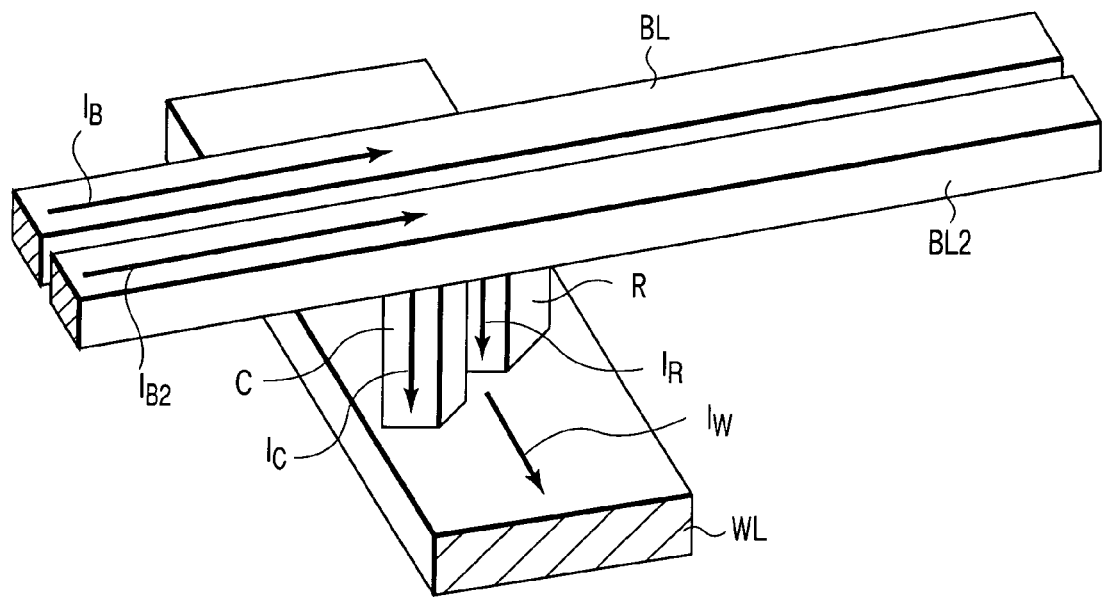
FIG. 59 is a perspective view showing schematically one of the memory cells according to the fifth embodiment.
Figure 60:
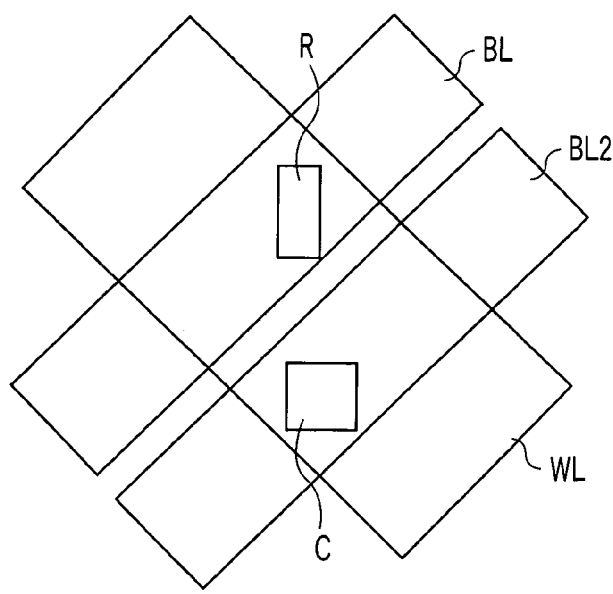
FIG. 60 is a top view of FIG. 59.

In FIGS. 59 and 60, wiring BL 2 parallel to the wiring BL is provided and the conductor layer C is connected to between the wiring BL2 and the wiring WL. Upon writing of data into the memory cell having this structure, in addition to the operation of FIGS. 57 and 58, a voltage is applied between an end of the wiring BL2 and an end of the wiring WL or current is supplied to between them. As a result, current $I_{B2}$ flows through the wiring BL2 and current $I_C$ flows through the conductor C. Current magnetic field by current $I_C$ is applied to the free layer FF.

Figure 61:
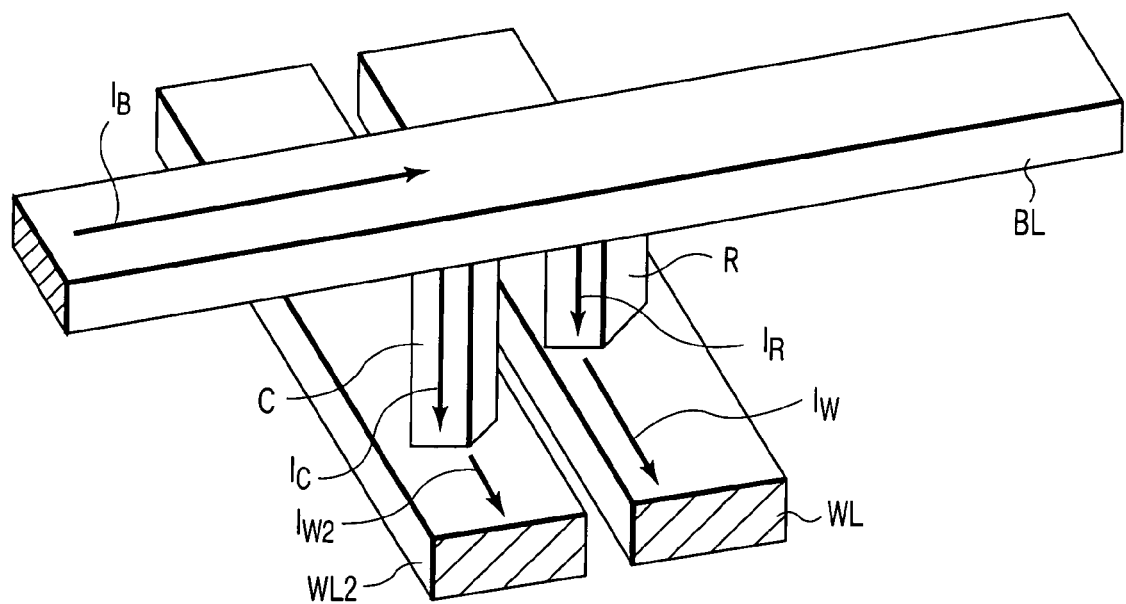
FIG. 61 is a perspective view showing schematically one of the memory cells according to the fifth embodiment.
Figure 62:
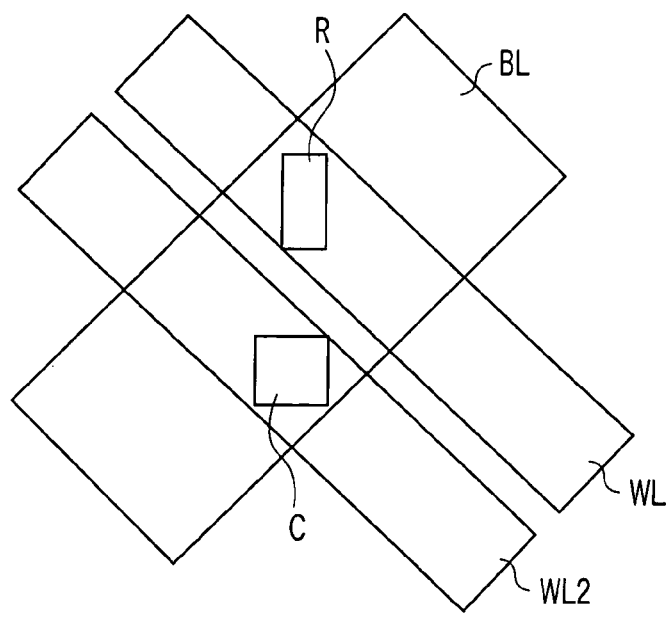
FIG. 62 is a top view of FIG. 61.

In FIGS. 61 and 62, wiring WL2 parallel to the wiring WL is provided and the conductor layer C is connected between the wiring BL and the wiring WL2. Upon writing of data into the memory cell having this structure, in addition to the operation of FIGS. 57 and 58, a voltage is applied between an end of the wiring BL and an end of the wiring WL2 or current is supplied to between them. As a result, current $I_{W2}$ flows through the wiring WL2 and current $I_C$ flows through the conductor C. Current magnetic field by current $I_C$ is applied to the free layer FF.

In FIGS. 63 and 64, wiring BL2 parallel to the wiring BL and wiring WL2 parallel to wiring WL are provided. The conductor layer C is connected to between the wiring BL2 and the wiring WL2. Upon writing of data into the memory cell having this structure, in addition to the operation of FIGS. 57 and 58, a voltage is applied between an end of the wiring BL2 and an end of the wiring WL2 or current is supplied to between them. As a result, current $I_{B2}$ flows through the wiring BL2 and current $I_{W2}$ flows through the wiring WL2 and current $I_C$ flows through the conductor C. Current magnetic field by current $I_C$ is applied to the free layer FF.

[5-2] Effect

According to the memory cell of the fifth embodiment, the conductor layer C is provided near the magnetic recording element R and current magnetic field from the conductor layer C is applied in the magnetization hard axis of the free layer FF as bias magnetic field $H_b$. Thus, the same effect as the first embodiment is obtained.

(6) SIXTH EMBODIMENT

The magnetic recording elements and the memory cells of the first to fifth embodiments can be applied to a variety of purposes because they have a fine magnetization switching mechanism. More specifically, these magnetic recording elements can be applied to a recording/reproducing apparatus such as MRAM by disposing a plurality thereof. The sixth embodiment concerns the magnetic recording device using the magnetic recording element and memory cell of the first to fifth embodiments.

[6-1] Structure

FIGS. 65 to 70 are top views showing schematically an example of the magnetic recording device of the sixth embodiment of the present invention. In FIGS. 65 to 68, the hard bias layer is constituted of a permanent magnet composed of material shown in the first embodiment. On the other hand, in FIGS. 69 and 70, the hard bias layer is constituted of an electric magnet. FIGS. 65 to 68 differ from each other in position of the hard bias layer HB.

As shown in FIGS. 65 to 70, a memory cell is constituted of the wiring BL and the wiring WL in addition to a structure comprised of the basic lamination film BML of the first embodiment, or the magnetic recording element R of the second embodiment or the magnetic recording element R and the conductor layer C of the fifth embodiment. Memory cells arranged in matrix constitute a memory cell array MCA. Memory cells are insulated electrically via insulation layer from each other.

The memory cells arranged on a same straight line share the same wiring WL and the wiring BL of the third and fifth embodiments. The wiring WL and the wiring BL are connected to a peripheral circuit P disposed around each memory cell array MCA. This peripheral circuit P can supply any required one of wirings WL and one of wirings BL with current. A memory cell connected to both the selected wiring WL and wiring BL are uniquely selected to be a target of writing and reading using the method described in the third or fifth embodiment.

When the memory cell of the fifth embodiment is employed, wiring BL2 is disposed parallel to each wiring BL (not shown) and wiring WL2 is disposed parallel to each wiring WL (not shown). Then, the wiring BL2 and the wiring WL2 are connected to the peripheral circuit P, so that current is uniquely supplied to the conductor C of a memory cell which is a write target by the peripheral circuit P.

Figure 65:
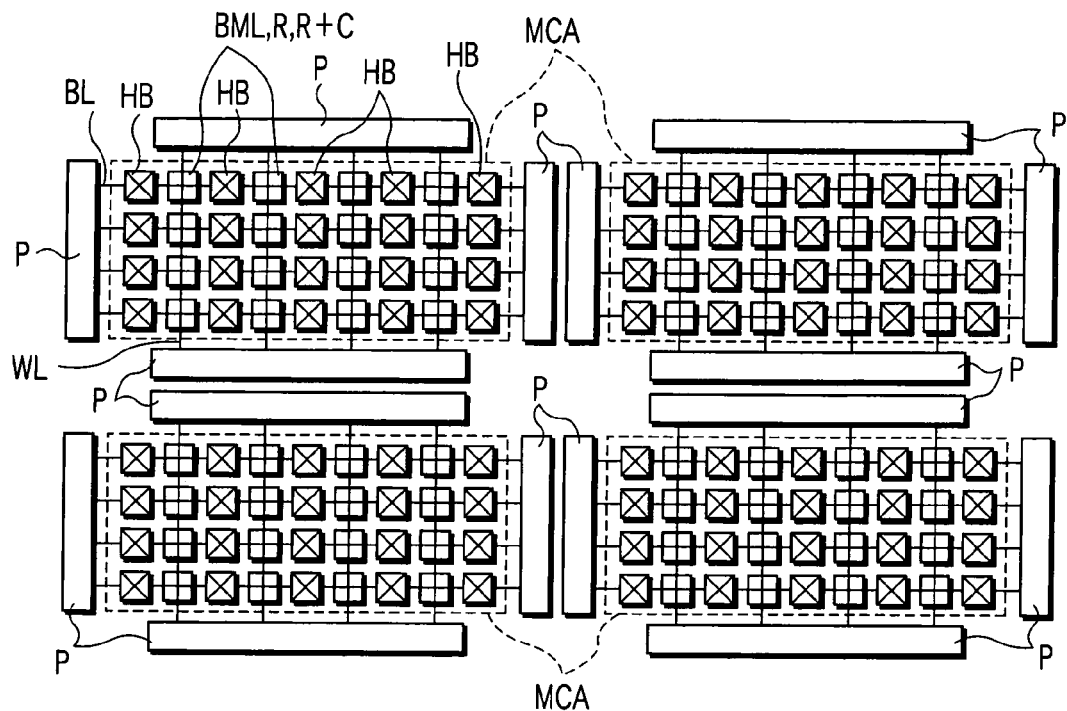

Referring to FIG. 65, the hard bias layers HB of the first embodiment line along each column and are separated from each other.

Figure 66:
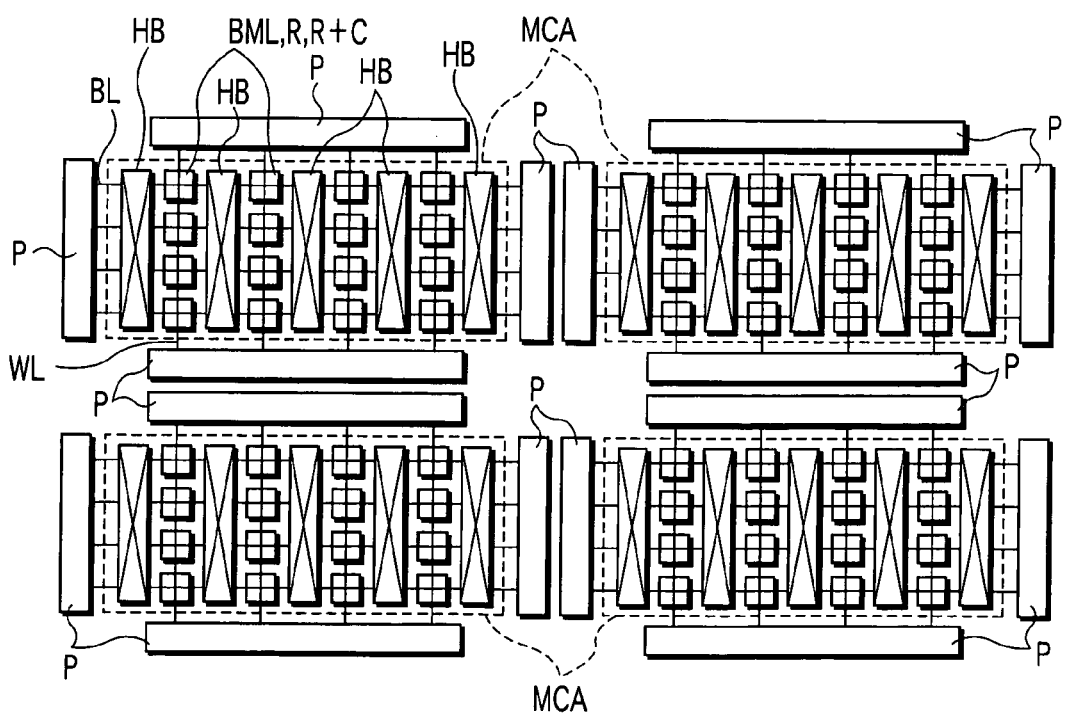
Figure 67:
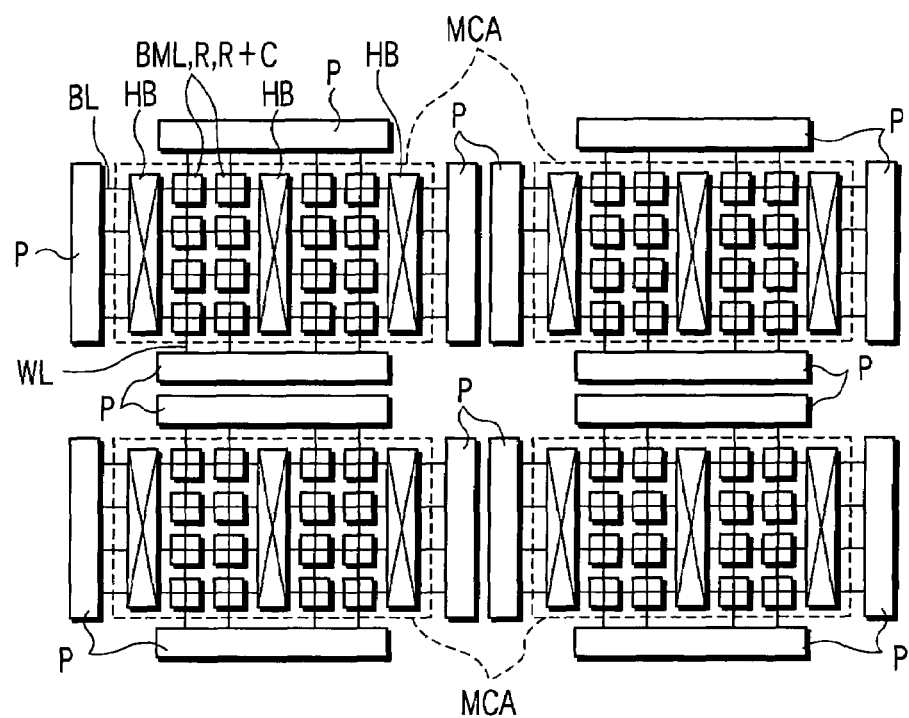

Referring to FIGS. 66 and 67, each the hard bias layer HB extends along each column and are not separated for every row. Each hard bias layer extends along each column in FIG. 66 and along every some columns (two columns in the same Figure) in FIG. 67.

Figure 68:
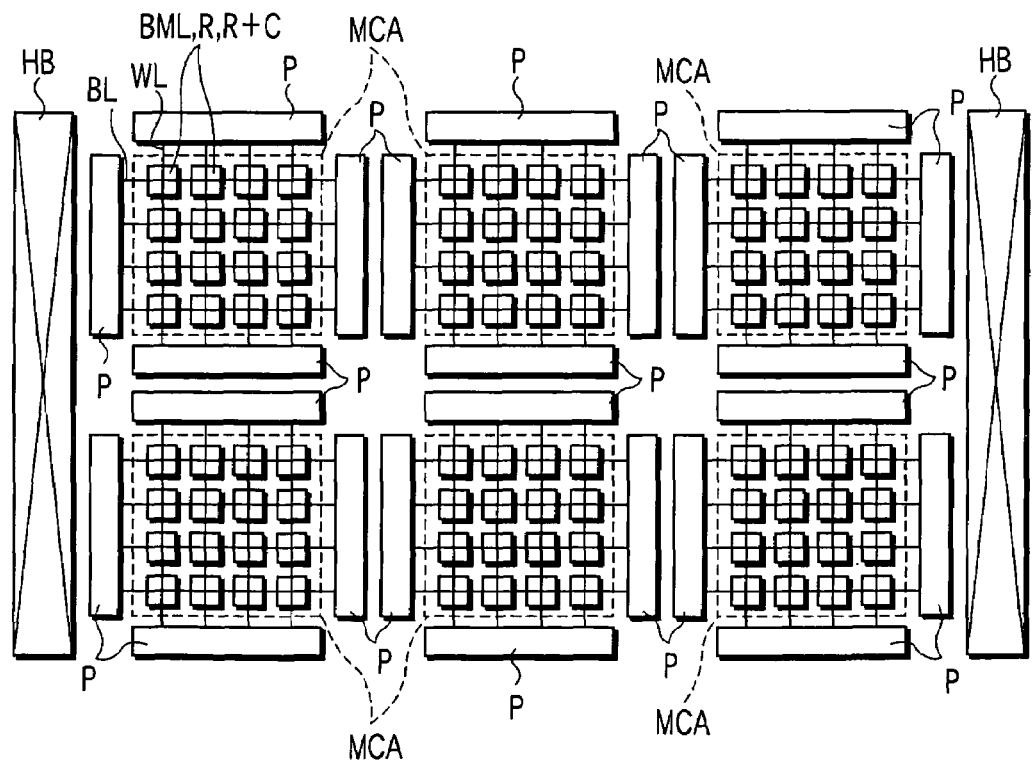

In FIG. 68, the hard bias layer HB is provided outside of a rectangular area composed of memory cells. Then, bias magnetic field $H_b$ is applied to all the memory cells from the same hard bias layers HB.

In FIG. 69, the hard bias layer $HB_M$ is provided outside of the memory cell array MCA and extends along and adjacent to the peripheral circuit P extending in the column direction of the memory cell. The hard bias layer $HB_M$ is used commonly among the adjoining memory cell arrays MCA. In FIG. 70, the hard bias layers are disposed in the same manner as in FIG. 68.

[6-2] Example

As an example of this embodiment, an example in which a magnetic recording device was produced using a magnetic recording element having the same structure as the sample of the example of the third embodiment will be described. FIG. 71 shows an example in which a memory cell contains a magnetic recording element R and a selection transistor T. In FIG. 71, the hard bias layer HB is omitted for simplicity. The magnetic recording element R is connected between the wiring (bit line) BL and an end of the selection transistor T. The other end of the selection transistor T is grounded and the gate is connected to the wiring (word line) WL.

Although in the example shown in FIG. 71, the selection transistor T is used for selection of the magnetic recording element R, other switching device may be used. A device with a low turned-on resistance is preferred. As such a device, for example, diode D may be used as shown in FIG. 72. In this case, the magnetic recording element R and diode D connected in series are connected between the word line WL and the bit line BL in each memory cell.

Figure 73:
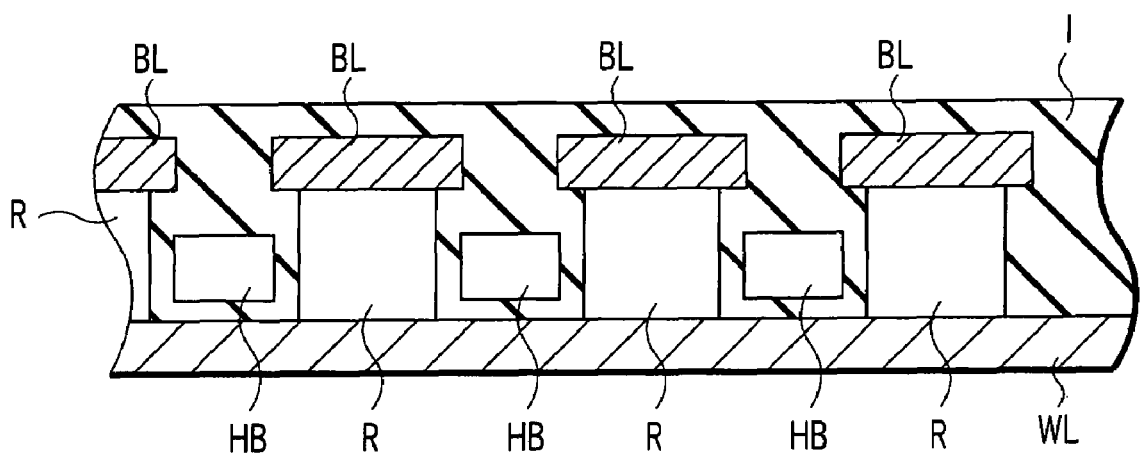
FIG. 73 is a sectional view showing part of memory cell according to the sixth embodiment.

The memory cell may be produced in a following process. That is, as shown in FIG. 73, a selection transistor T (not shown) and a lower layer wiring WL connected electrically to the selection transistor T are provided on a semiconductor substrate (not shown) by processes of, for example, lithography, anisotropic etching such as reactive ion etching (RIE) and ion implantation. Next, the magnetic recording element R and the hard bias layer HB are formed on the lower wiring WL in the same manner as described in the first embodiment and further, upper wiring BL is formed on the magnetic recording element R. A gap between each magnetic recording element R and the hard bias HB is filled with insulation film I.

Such memory cells are disposed in matrix in the memory cell array MCA and the gate of each selection transistor of memory cells belonging to the same row is connected to the same wiring WL. Likewise, memory cells belonging to the same column are connected to the same wiring BL. A peripheral circuit P including decoders, reading circuits, current supply circuits is provided around the memory cell array MCA. The wiring BL and the wiring WL are connected to the peripheral circuit P.

The decoders passes write current, read current and the like to the wirings BL, WL passing the memory cell having an address specified by an address signal from outside. A selection transistor T is turned ON by selecting the wiring of the transistor T connected to a target memory cell when information is written or read out. Next, writing and reading are executed by flowing write current or read current to the wiring connected to the target memory cell. A range of current value for writing and reading and its method are as described in the first embodiment.

The embodiments of the present invention are described with reference to specific examples above. However, the present invention is not restricted to these examples. For example, specific dimensions and material of each element constituting the magnetic recording element, and shape and material of electrodes, for passivation, and of insulation structure are included in the scope of the present invention as long as those skilled in the art can obtain the same effect as the present invention intends when carrying out the present invention by selecting appropriately from a well known range.

The components of the magnetic recording element, such as the antiferromagnetic layer, intermediate layer and insulation layer may be formed in a single layer each or in multilayer structure composed of two or more layers.

All magnetic recording elements and magnetic recording devices which those skilled in the art can implement by modifying appropriately based on the magnetic recording element and magnetic recording device described above as the embodiments of the present invention belong to the scope of the present invention as long as the gist of the invention is included.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic recording element comprising:
   a first fixed layer having a first face and a second face opposing each other and having a magnetization direction fixed in a direction penetrating the first face and the second face;
   a free layer having a third face and a fourth face opposing each other, having anisotropy field having a first value magnitude, having a magnetization easy axis and a magnetization hard axis both extending along the third face or the fourth face, and having a magnetization direction which changes according to a direction of a current flowing through the first face and the fourth face with a magnetic field applied to the free layer in a fixed direction or according to a direction of a magnetic field applied to the free layer with a current flowing through the first face and the fourth face in a fixed direction;
   a first intermediate layer consisting essentially of nonmagnetic material and provided between the second face and the third face; and
   a magnetic field generating layer configured to apply a magnetic field having magnitude smaller than the first value to the free layer along the magnetization hard axis.

2. The magnetic recording element according to claim 1, further comprising:
   a second intermediate layer facing the fourth face of the free layer and essentially consisting of nonmagnetic material; and
   a second fixed layer facing the second intermediate layer at on opposite side to the free layer and having magnetization direction fixed along the first face or the second face.

3. The magnetic recording element according to claim 1, wherein the magnetic field generating layer includes a permanent magnet or an electric magnet.

4. The magnetic recording element according to claim 1, wherein the magnetic field generating layer includes a magnetic layer, has magnetization direction fixed along the magnetization hard axis and is placed apart from the free layer along the magnetization hard axis.

5. The magnetic recording element according to claim 1, wherein the magnetic field generating layer includes a magnetic layer, has magnetization direction fixed along the magnetization hard axis and is placed at, at least, one of a position facing the first face and a position facing the free layer at an opposite side to the first intermediate layer.

6. The magnetic recording element according to claim 1, wherein the magnetic field generating layer includes at least one of a first wiring electrically connected to the first fixed layer and a second wiring electrically connected to the free layer; and
   a component in the magnetization hard axis of synthetic magnetic field of magnetic field applied from the magnetic field generating layer to the free layer and magnetic field generated by electron flow which flows in the first wiring or the second wiring and is large enough to switch the magnetization direction of the free layer is smaller than the first value.

7. The magnetic recording element according to claim 1, wherein the magnetic field generating layer includes a first wiring electrically connected to the first fixed layer, a second wiring electrically connected to the free layer and a third wiring provided along and apart from the first wiring or along and apart from the second wiring; and
   a component in the magnetization hard axis of synthetic magnetic field of a magnetic field applied from the magnetic field generating layer to the free layer, a magnetic field generated by electron flow which flows in the first wiring or the second wiring and is large enough to switch the magnetization direction of the free layer, and a magnetic field generated by current flowing in the third wiring is smaller than the first value.

8. The magnetic recording element according to claim 1, wherein the magnetic field generating layer includes a conductor layer to which current is supplied upon writing.

9. The magnetic recording element according to claim 1, wherein the first intermediate layer consists essentially of nonmagnetic metal.

10. The magnetic recording element according to claim 2, wherein the second intermediate layer includes an insulator or a semiconductor.

11. A magnetic recording device including a memory array in which magnetic recording elements are disposed in matrix, the magnetic recording element comprising:
- a first fixed layer having a first face and a second face opposing each other and having a magnetization direction fixed in a direction penetrating the first face and the second face;
- a free layer having a third face and a fourth face opposing each other, having anisotropy field having a first value magnitude, having a magnetization easy axis and a magnetization hard axis both extending along the third face or the fourth face, and having a magnetization direction which changes according to a direction of a current flowing through the first face and the fourth face with a magnetic field applied to the free layer in a fixed direction or according to a direction of a magnetic field applied to the free layer with a current flowing through the first face and the fourth face in a fixed direction;
- a first intermediate layer consisting essentially of nonmagnetic material and provided between the second face and the third face; and
- a magnetic field generating layer configured to apply a magnetic field having magnitude smaller than the first value to the free layer along the magnetization hard axis.

12. The magnetic recording device according to claim 11, wherein each of the magnetic recording elements comprises a first end and a second end; and
the magnetic recording device further comprises:
- first wirings electrically connected to the first end of each of the magnetic recording elements belonging to a same row;
- second wirings electrically connected to the second end of each of the magnetic recording elements belonging to a same column; and
- a control circuit connected to the first wirings and the second wirings and passing current to the first wirings and the second wirings to write and read information to one of the magnetic recording elements.

13. The magnetic recording device according to claim 11, wherein the magnetic field generating layer includes a permanent magnet or an electric magnet.

14. The magnetic recording device according to claim 11, wherein the magnetic field generating layer includes conductor layer to which current is supplied upon writing.

15. The magnetic recording device according to claim 11, wherein the first intermediate layer consists essentially of nonmagnetic metal.

16. The magnetic recording device according to claim 11, further comprising:
- a second intermediate layer facing the fourth face of the free layer and essentially consisting of nonmagnetic insulator or nonmagnetic semiconductor; and
- a second fixed layer facing the second intermediate layer at on opposite side to the free layer and having magnetization direction fixed along the first face or the second face.

17. An information recording method to a magnetic recording element which comprises a fixed layer, a free layer and a intermediate layer, the fixed layer having a first face and a second face opposing each other and having a magnetization direction fixed in a direction penetrating the first face and the second face, the free layer having a third face and a fourth face opposing each other, having anisotropy field having a first value magnitude, and having a magnetization easy axis and a magnetization hard axis both extending along the third face or the fourth face, the intermediate layer consisting essentially of nonmagnetic material and provided between the second face and the third face, the method comprising:
- applying a first magnetic field to the free layer along the magnetization hard axis of the free layer, the first magnetic field having magnitude smaller than anisotropy field of the free layer; and
- conducting application of a second magnetic field to the free layer and introduction of a first current in a direction penetrating the first face and the fourth face while the first magnetic field being applied to the free layer, a direction of the second magnetic field being fixed and the first current flowing in a direction according to a required direction of a magnetization of the free layer or the first current flowing in a fixed direction and a direction of the second magnetic field varying according to a required direction of a magnetization of the free layer.

18. The information recording method according to claim 17, wherein applying a first magnetic field to the free layer includes applying the first magnetic field by a magnetic field generating layer.

19. The information recording method according to claim 17, wherein applying a first magnetic field to the free layer includes applying the first magnetic filed generated by current flowing at least in a first wiring electrically connected to the first fixed layer and a second wiring electrically connected to the free layer.

20. The information recording method according to claim 17, wherein applying a first magnetic field to the free layer includes applying the first magnetic field generated by current flowing in a conductive layer connected to a first wiring electrically connected to the first fixed layer and connected to a second wiring electrically connected to the free layer.

* * * * *